US008416033B2

(12) United States Patent
Itoh et al.

(10) Patent No.: US 8,416,033 B2
(45) Date of Patent: Apr. 9, 2013

(54) COMPACT DUAL-BAND METAMATERIAL-BASED HYBRID RING COUPLER

(75) Inventors: Tatsuo Itoh, Rolling Hills, CA (US); Pei-Ling Chi, Hsinchu (TW); Cheng-Jung Lee, Hsinchu (TW)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/311,456

(22) Filed: Dec. 5, 2011

(65) Prior Publication Data

US 2012/0139661 A1 Jun. 7, 2012

Related U.S. Application Data

(63) Continuation of application No. 12/434,210, filed on May 1, 2009, now Pat. No. 8,072, 291.

(60) Provisional application No. 61/054,789, filed on May 20, 2008.

(51) Int. Cl.
*H01P 5/22* (2006.01)
*H03H 7/32* (2006.01)

(52) U.S. Cl. ....................................... 333/120; 333/118

(58) Field of Classification Search .................. 333/109, 333/117, 118, 120, 126
See application file for complete search history.

(56) References Cited

U.S. PATENT DOCUMENTS

| | | | | |
|---|---|---|---|---|
| 6,822,531 | B2 | 11/2004 | Carlson | |
| 7,187,251 | B2 | 3/2007 | Chirala et al. | |
| 7,446,712 | B2 | 11/2008 | Itoh et al. | |
| 7,667,555 | B2 | 2/2010 | Itoh et al. | |
| 7,675,384 | B2 | 3/2010 | Itoh et al. | |
| 8,072,291 | B2 * | 12/2011 | Itoh et al. | 333/120 |
| 2005/0253667 | A1 * | 11/2005 | Itoh et al. | 333/118 |
| 2008/0048917 | A1 | 2/2008 | Achour et al. | |
| 2008/0258981 | A1 | 10/2008 | Achour et al. | |
| 2009/0002093 | A1 | 1/2009 | Itoh et al. | |
| 2010/0295630 | A1 | 11/2010 | Itoh et al. | |

FOREIGN PATENT DOCUMENTS

KR 10-2004-0062297 A 2/2005

OTHER PUBLICATIONS

Okabe et al., A Compact Enhanced-Bandwidth Hybrid Ring Using an Artificial Lumped-Element Left-Handed Transmission-Line Section, Mar. 2004, IEEE Transactions on Microwave Theory and Techniques, vol. 52 No. 3, 798-804.*

Okabe et al., A Compact Enhanced-Bandwidth Hybrid Ring Using an Artificial Lumped-Element Left-Handed Transmission-Line Section, Mar. 2004, IEEE Transactions on Microwave Theory, vol. 52, No. 3, pp. 798-804.*

(Continued)

*Primary Examiner* — Dean O Takaoka
(74) *Attorney, Agent, or Firm* — John P. O'Banion

(57) ABSTRACT

A compact multi-band hybrid ring (rat-race) coupler utilizing a ring of composite right-handed and left-handed (CRLH) transmission lines (TLs) and multiple ports, provides miniaturization and the ability to operate at arbitrary frequency bands unlike conventional couplers. The hybrid ring is made compact, such as by constraining phase delay contributions $|\phi_1|, |\phi_2| \leqq 270°$. The coupler can be used in many applications, for example as a mode decoupling network in a dual-band front-end MIMO system. The inclusion of a CRLH delay line is also described which alters the phase relationship of the signals and is particularly well suited for extending pattern diversity in response to frequency.

20 Claims, 14 Drawing Sheets

OTHER PUBLICATIONS

Lin, I. et al. "Arbitrary Dual-Band Components Using Composite Right/Left-Handed Transmission Lines"—IEEE Trans. Micro T&T, Apr. 2004, vol. 52, No. 4, pp. 1142-1149.
Sanayai, S. et al. "Antenna Selection in MIMO Systems"—IEEE Communications Mag., Oct. 2004, vol. 42, No. 10, pp. 68-73.
Lee, T-I. et al. "Mode-Based Beamforming with Closely Spaced Antennas"—2007 IEEE MTT-S Int. Microwave Symp. Dig., Jun. 2007, pp. 1723-1726.
Kim, K.M. et al. "High Isolation Internal Dual-Band Planar Inverted-F Antenna Diversity System with Band-Notched Slots for MIMO Terminals"—36th Annual European Micro. Conf., Sep. 2006, pp. 1414-1417.
Crispim, N. et al. "Small Dual-Band Microstrip Patch Antenna Array for MIMO System Applications"—2004 IEEE AP-S Symp., Jun. 2004, vol. 1, pp. 237-240.
Stoytchev, M. et al. "Beyond 3G: Metamaterials Application to the Air Interface"—2007 IEEE AP-S Symp., Jun. 2007, pp. 1160-1163.
Diedtrich, C. et al. "Spatial, Polarization, and Pattern Diversity for Wireless Handheld Terminals"—IEEE Trans. Ant., Sep. 2001, vol. 49, No. 9, pp. 1271-1281.
Chi, P. et al. "A Compact Dual-Band Metamaterial-Based Rat-Race Coupler for a MIMO System Application"—IEEE MTT-S Int. Micro. Symp. 2008, Jun. 2008, pp. 667-670.
Chi, P-L. et al. "Metamaterial-Based Components for a Compact Dual-Band beam Pattern Diversity Systems"—38th European Micro. Conf., Amsterdam, The Netherlands, Oct. 27-31, 2008, pp. 555-558.
Chi, P-L, et al. "Novel Diplexer Synthesis Using the Composite Right/Left-Handed Phase-Advance/Delay Lines"—2009 IEEE MTT-S Int. Micro. Symp., Jun. 7-12, 2009, Boston, MA , pp. 117-120.
Korean Intellectual Property Office (KIPO), International Search Report and Written Opinion issued on Nov. 30, 2009, including claims searched, related PCT International Patent Application PCT/US2009/042533, pp. 1-14.

* cited by examiner

COMPACT DUAL-BAND METAMATERIAL-BASED HYBRID RING COUPLER

CROSS-REFERENCE TO RELATED APPLICATIONS

This application is a continuation of U.S. patent application Ser. No. 12/434,210 filed on May 1, 2009, now U.S. Pat. No. 8,072,291, incorporated herein by reference in its entirety, which claims priority from U.S. provisional patent application Ser. No. 61/054,789 filed on May 20, 2008, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to high-frequency coupling devices, and more particularly to microwave hybrid ring couplers and beam pattern diversity systems utilizing artificial composite right/left-handed transmission lines.

2. Description of Related Art

Couplers are passive microwave components used for distributing or combining microwave signals. Couplers are usually three or four-port devices used for injecting a second signal into a network, or as a means to sample a signal within a network, while these couplers also provide reciprocal functions. Couplers are used in circuits to generate separate signal channels with desirable characteristics. Conventional couplers may be divided into two categories: coupled-line couplers (backward, forward) and tight-couplers (e.g., branch-line, hybrid ring, and so forth). While the former are limited to loose coupling levels (typically less than −3 dB) because of the excessively small gap required for tight coupling, the latter are limited in bandwidth (i.e., typically less than 20%).

Conventional hybrid ring couplers, also referred to as 3 dB, 180° hybrid ring couplers, are often referred to as rat-race couplers in view of their circular shape as shown in FIG. 1. The hybrid ring coupler 10 is a ring-shaped transmission line 12 having four ports for equally splitting an input signal or for generating a sum or difference in the signals. Ports are shown in FIG. 1 as a summation port (Port 1) 14, a first output port (Port 2) 16, a second output port (Port 3) 18, and a difference port (Port 4) 20. One of the benefits of using a hybrid ring is that it alternately provides equally-split, but 180 degree phase-shifted, output signals. It should be appreciated that the coupler may be similarly utilized for input as well. In a conventional hybrid ring coupler the center conductor ring is 1½ wavelengths in circumference (or six ¼ wavelengths) and each port is separated by 90°. This configuration creates a loss-less device with low variable standing wave ratio (VSWR), excellent phase and amplitude balance, high output isolation and matching output impedances. Yet these rat-race (hybrid ring) couplers have the shortcomings of narrow bandwidth and large size. Applications for rat-race couplers are numerous, including mixers and phase shifters, and so forth.

However, the use of couplers is often problematic as many wireless LAN systems operate in two frequency bands having some desired relationship, and thus require dual-band components, such as the use of two hybrid ring couplers. Furthermore, the need for small and light-weight systems lead to the desire to employ compact components in front-end systems. Conventional couplers exhibit an inherent harmonic relationship between their operating frequencies, while the operating frequency and the physical dimensions of the structure make it challenging to design a compact dual-band component based on conventional methodology.

Due to the requirement for increasing levels of data throughput on limited channels, researchers in the wireless communication field have substantially directed their efforts toward increasing capacity without occupying more spectral resources. Multiple-input multiple-output (MIMO) systems have received recent attention in wireless communications because of their attractive capability of linearly increasing capacity with respect to the number of antennas in the transmitter/receiver space. Derived from the MIMO concept, space, polarization, and pattern diversity are three common approaches to enhance the channel capacity. Among these, pattern diversity is preferred for a number of applications as it has low space requirements and presents a set of orthogonal radiation patterns using a mode decoupling network. In certain applications, conventional 90° hybrids have been used to achieve pattern orthogonality generated by exciting either of the input ports. Although some attention has been focused on antenna pattern diversity systems, there has been scant attention focused on dual-band applications and thus system applicability is restricted. It should be appreciated that conventional couplers can be used as dual-band components only at odd multiple frequencies of the first band.

Accordingly, a need exists for a system and method of coupling microwave signals while not being constrained to operating frequency relationships or a single relationship between operating frequency and physical dimensions. These needs and others are met within the present invention, which overcomes the deficiencies of previously developed coupler system and methods.

BRIEF SUMMARY OF THE INVENTION

The present invention is a compact multi-band rat-race (hybrid ring) coupler utilizing composite right left-handed (CRLH) transmission lines (TLs). The term “rat-race coupler” is used herein synonymously with the more descriptive term “hybrid ring coupler.” Various combinations of phase responses in the individual TLs in the coupler are discussed and an embodiment of a dual-band miniaturized rat-race coupler is detailed which shows a 55% size reduction in comparison with conventional rat-race couplers.

In one application this composite right/left handed transmission line-based coupler is used as a mode decoupling network in a dual-band front-end MIMO system, along with a planar antenna array, to split two orthogonal radiation modes from the connected array. A pair of compact dual-band antennas were fabricated in close proximity (spatially constrained) to demonstrate pattern diversity by in-phase or out-of-phase excitations from the coupler. High levels of isolation were found exhibited by the experimental embodiment with −29 dB at 2.4 GHz and −34.2 dB at 5.2 GHz, which verifies the desired decoupling property, while providing practical levels of isolation for numerous applications. Furthermore, pattern diversity in MIMO communications was observed by two measured orthogonal radiation patterns.

One embodiment of the compact dual-band beam pattern diversity system is configured to be beam-formable in response to employing a CRLH phase delay line, which introduces different phase delays at each of the two operating bands, for example at 2.4 GHz and 5.2 GHz. Accordingly, the embodied dual-band pattern diversity system is capable of exhibiting endfire patterns at the higher operational frequency while having sum/difference radiation modes at the lower frequency. The inclusion of CRLH components in the system leading to beam pattern diversity provides more flexibility in the overall system. Two sets of orthogonal radiation patterns are demonstrated at the dual frequencies while the system provides sufficient isolation for practical use in numerous applications.

The invention is amenable to being embodied in a number of ways, including but not limited to the following descriptions.

One embodiment of the invention is an apparatus for coupling microwave signals, comprising: (a) a ring of composite right/left-handed (CRLH) transmission line (TL) material having both right-handed (e.g., from microstrip line sections) and left-handed (e.g., in response to lumped elements) characteristics and configured to operate in at least two bands comprising a first band $f_1$ and a second band $f_2$ within a multi-band hybrid ring (rat-race) coupler having at least four ports including a sum port and a difference port; (b) a plurality of ports on the ring separated along the periphery of the ring by either phase $\phi_1$ or phase $\phi_2$ to form a hybrid ring coupler. Compactness of the CRLH hybrid ring is achieved in response to constraining phase delay contributions to $|\phi_1|, |\phi_2| \leqq 270°$.

The hybrid ring in this configuration provides arbitrary dual-band operation in which $f_2$ need not be a multiple of $f_1$, and $f_2$ need not be equal to $3f_1$ as required in the conventional hybrid ring. In the present invention, the TL segments are utilized with configurable non-linear phase responses in response to the inclusion of the left handed (LH) materials. The dual-frequency characteristics of each segment of the CRLH TL arises in response to an anti-parallel relationship between phase and group velocities below a transition frequency $\omega_0$, within the left handed material (LH), and a co-directional relationship between phase and group velocities above transition frequency $\omega_0$ within the right-handed material (RH). Implementations of the present invention are particularly well suited for microwave signal applications having a transition frequency $\omega_0$ at or above approximately 100 MHz.

In at least one implementation of the invention, both phase delay and advance are greater than zero ($\phi_1, \phi_2 > 0$). In at least one implementation of the invention $\phi_1$ is an odd integral multiple of 90° at both $f_1$ and $f_2$, with $\phi_1$ either negative or positive in response to phase lead/lag properties of the CRLH TL, and $\phi_2$ is 180° out of phase with $\phi_1$ at $f_1$ and $f_2$. In at least one implementation of the invention, the absolute value of both $\phi_1$ and $\phi_2$ is less than or equal to 270°; $|\phi_1|, |\phi_2| \leqq 270°$. In at least one implementation $\phi_1$ is an odd integral multiple of 90° at both $f_1$ and $f_2$, with $\phi_1$ either negative or positive in response to phase lead/lag properties of the CRLH TL; and in which $\phi_2$ is 180° out of phase with $\phi_1$ at $f_1$ and $f_2$.

In at least one implementation, the LH portion of the CRLH TL comprises lumped elements; in particular, each segment of the TL between each of the ports contains both RH (e.g., microstrip line) as well as lumped LH elements (e.g., discrete capacitors and inductors). According to one implementation, the LH portion of the phase advance TL section $\phi_2$ further comprises stepped impedance sections which are tuned toward compensating for the self-resonant effect of the lumped elements.

In at least one implementation, the CRLH TL segments of the apparatus can be symmetrical with respect to the midpoint of each segment of CRLH TL within the ring, so that each side is preferably a mirror-image of the TL segment on the other side of the midpoint. In one implementation the ports are configured with substantially identical port impedances for the sake of matching convenience.

In at least one implementation of the invention the isolation provided between the sum port and difference port exceeds 20 dB, while the size of the hybrid ring coupler has a diameter smaller than a conventional hybrid ring coupler operating at the lower of the bands supported by the apparatus.

In at least one implementation the hybrid ring coupler is configured as the front end for a multiple-input multiple-output (MIMO) antenna array. By way of example and not limitation, a first antenna element of the MIMO antenna array is coupled to a first port of the apparatus, and a second antenna element of the MIMO antenna array is coupled to a second port of the apparatus.

One embodiment of the invention is an apparatus for coupling microwave signals to a multiple-input multiple-output (MIMO) antenna array, comprising: (a) a ring of composite right/left-handed (CRLH) transmission line (TL) material having both right-handed (e.g., microstrip) and left-handed (e.g., lumped elements) characteristics toward operating in at least two bands comprising a first band $f_1$ and a second band $f_2$ within a multi-band rat-race coupler; (b) a plurality of ports on the ring separated along the periphery of the ring by either phase $\phi_1$ or phase $\phi_2$, and comprising a first port, a second port, a sum port and a difference port, and preferably both phase delays and advance are greater than zero ($\phi_1, \phi_2 > 0$). The apparatus provides arbitrary dual-band operation in which $f_2$ need not be equal to $3f_1$, in response to utilizing TL segments with designable non-linear phase responses. In one preferred implementation the LH portion utilizes stepped impedance sections in the TL segment corresponding to $\phi_2$. These stepped impedances are tuned toward compensating for the self-resonant effect of the lumped elements.

In the MIMO application, the first port is configured for attachment to a first antenna element of the MIMO antenna array, and the second port is configured for attachment to a second element of the MIMO antenna array.

In a preferred implementation, $\phi_1$ is an odd integral multiple of 90° at both $f_1$ and $f_2$, with $\phi_1$ either negative or positive in response to phase lead/lag properties of the CRLH TL, while $\phi_2$ is 180° out of phase with $\phi_1$ at $f_1$ and $f_2$.

In at least one implementation, each CRLH TL segment of the apparatus is symmetrical about the midpoint of the CRLH TL. For matching convenience each of the ports is preferably configured with the same port impedance.

One embodiment of the invention is an apparatus for coupling microwave signals at dual frequency bands to an antenna array, comprising: (a) a dual-band CRLH hybrid ring coupler of composite right/left-handed (CRLH) transmission line (TL) material having both right handed (RH) and left handed (LH) characteristics; (b) a plurality of lumped elements comprising inductances and capacitances within the LH portions of the dual-band CRLH hybrid ring coupler; (c) a plurality of ports on the dual-band CRLH hybrid ring comprising a first input/output port, a second input/output port, a sum port, and a difference port, with the ports separated along the dual-band CRLH hybrid ring by phase $\phi_1$ or phase $\phi_2$; (d) a CRLH-based phase delay line configured for tuning the phase excitation from the dual-band CRLH hybrid ring by introducing a first phase delay at a first frequency band, and a second phase delay at a second frequency band; and (e) an antenna array having at least a first antenna element and a second antenna element coupled to the CRLH hybrid ring and the CRLH phase delay line.

The dual-band CRLH hybrid ring and CRLH phase delay line are configured to operate in at least two frequency bands comprising a first frequency band $f_1$ and a second frequency band $f_2$ which has an arbitrary relationship with $f_1$. Diverse antenna patterns can be supported from the antenna array in response to use of the sum and difference ports and in combination with variable phase shifts provided by the phase delay line.

One embodiment of the invention is a method of coupling microwave signals to a multiple-input multiple-output (MIMO) antenna array, comprising: (a) selecting a desired first frequency and second frequency of operation for a hybrid ring coupler using composite right-hand and left-hand (CRLH) transmission line based on selection of microstrip lines and left-handed lumped elements for each segment of the ring containing at least a first port, second port, sum port and difference port; (b) connecting the first port of the hybrid ring coupler to a first antenna, and the second port of the hybrid ring coupler to a second antenna; (c) exciting either the sum or the difference port at the desired first and/or second frequency to generate a sum or difference radiation pattern on the first and second antennas. It will be appreciated that the coupler may also be reciprocally utilized in a receiving mode with the two antennas.

The present invention provides a number of beneficial aspects which can be implemented either separately or in any desired combination without departing from the present teachings.

An aspect of the invention is to provide a hybrid ring of composite right/left-handed (CRLH) transmission line (TL) material having both right and left handed characteristics.

Another aspect of the invention is to provide a hybrid ring that can be utilized for input and output as a separate device, or incorporated within a system.

Another aspect of the invention is to provide a hybrid ring having a plurality of ports (e.g., four) separated along the periphery of said ring by either phase $\phi_1$ or phase $\phi_2$.

Another aspect of the invention is to provide a hybrid ring including sum and difference ports.

Another aspect of the invention is to provide a hybrid ring of CRLH TL material in which the LH portion comprises lumped elements.

Another aspect of the invention is to provide a hybrid ring in which the lumped elements of the LH portion are configured with stepped impedances in the TL segment corresponding to $\phi_2$, and which are tuned toward compensating for the self-resonant effect of the lumped elements.

Another aspect of the invention is to provide a hybrid ring coupler (rat-race coupler) which is smaller than conventional couplers for a given lower frequency band of operation.

Another aspect of the invention is to provide a high-frequency coupler which can operate at multiple bands which need not have a fixed relationship (thereby frequency relationship can be arbitrarily selected), such as the $f_2=3f_1$ relationship required by conventional couplers, and need not follow any integral relationship such as $f_2=n\times f_1$ where n is an integer value.

Another aspect of the invention is to provide a hybrid ring coupler in which both phase delay and advance are greater than zero ($\phi_1$, $\phi_2>0$).

Another aspect of the invention is to provide a hybrid ring coupler in which $\phi_1$ is an odd integral multiple of 90° at both $f_1$ and $f_2$, with $\phi_1$ either negative or positive in response to phase lead/lag properties of the CRLH TL.

Another aspect of the invention is to provide a hybrid ring coupler in which $\phi_2$ is 180° out of phase with $\phi_1$ at $f_1$ and $f_2$.

Another aspect of the invention is to provide a compact hybrid ring coupler in response to constraining phase delay contributions to $|\phi_1|, |\phi_2| \leqq 270°$.

Another aspect of the invention is to provide a hybrid ring coupler providing arbitrary dual-band operation in response to utilizing TL segments with designable non-linear phase responses.

Another aspect of the invention is the use of artificial composite right/left-handed transmission line technology to implement novel couplers which provide enhanced operating characteristics such as efficiency, bandwidth, size, frequency response, and so forth.

Another aspect of the invention is to provide a hybrid ring coupler which is suited for use as a front end on systems utilizing MIMO transmission and reception principles.

Another aspect of the invention is to provide an apparatus for coupling microwave signals to an antenna array and supporting dual frequency bands.

Another aspect of the invention is to provide an apparatus for coupling dual frequency bands to an antenna array in response to quadrature-phase excitation from the summation port of the CRLH hybrid ring coupler.

Another aspect of the invention is to provide an apparatus capable of tuning the phase relationships of the signals output from the CRLH hybrid ring.

Another aspect of the invention is to provide an apparatus capable of tuning the phase relationships of the signals output from the CRLH hybrid ring to specific phase relationships in response to operating frequency band.

Another aspect of the invention is to provide an apparatus for coupling signals to an antenna array with high levels of input port isolation.

Another aspect of the invention is to provide an apparatus for coupling signals to antenna elements, such as spaced at $\lambda/4$, to generate endfire radiation patterns.

Another aspect of the invention is to provide a hybrid ring coupler in which isolation is provided between the sum and difference port exceeding 20 dB.

Another aspect of the invention is to provide coupler apparatus and methods which are applicable to microwave devices and systems operating at or above frequencies of approximately 100 MHz.

A still further aspect of the invention is to provide a hybrid ring coupler and methods of implementing couplers which are applicable to a number of microwave devices and systems.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1:
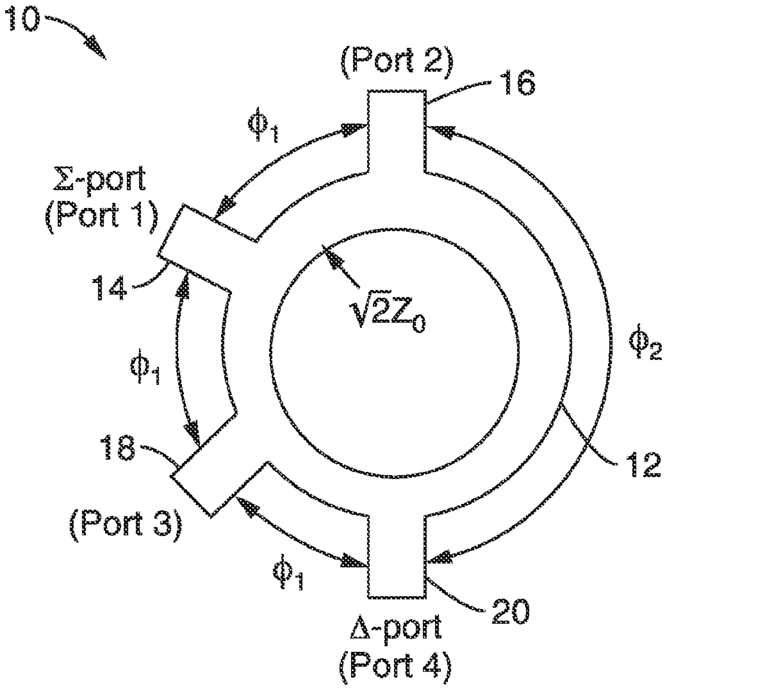
FIG. 1 (Prior Art)
FIG. 1 is a schematic of a conventional hybrid ring coupler showing four ports about the periphery of the coupler ring.

Referring more specifically to the drawings, for illustrative purposes the present invention is embodied in the apparatus generally shown in FIG. 2 through FIG. 15. It will be appreciated that the apparatus may vary as to configuration and as to details of the parts, and that the method may vary as to the specific steps and sequence, without departing from the basic concepts as disclosed herein.

1. INTRODUCTION

Artificial right-handed (RH), left-handed (LH) and composite right/left-handed (CRLH) transmission lines (TL) are constituted of series-L/shunt-C, series-C/shunt-L, and the series combination of the two, respectively. The LH TL is the electrical dual of the conventional RH TL, with the positions of the inductors (L) and capacitors (C) having been interchanged. It will be appreciated that the RH TL has a negative phase response (phase lag) while the LH TL provides a positive phase response (phase lead). It should also be appreciated that within the CRLH TL material a left-handed anti-parallel relationship exists between phase and group velocities below a transition frequency, ($\omega_0$, while a right-handed parallel relationship between phase and group velocities above transition frequency $\omega_0$. Devices according to the invention are configured for operation toward the microwave frequency range, with a transition frequency $\omega_0$ at or above approximately 100 MHz, and more preferably in the GHz range. Accordingly, the use of the CRLH TL material can provide each segment of a coupler with dual frequency characteristics. The present invention teaches microwave multi-band couplers based on the use of artificial CRLH TLs.

In order to implement arbitrary dual-band components, the present invention successfully utilizes metamaterial-based CRLH TLs. These types of transmission lines have a phase response that can be configured by changing certain parameters of the structure whereby arbitrary dual-band operation can be achieved. This approach is demonstrated in several components including a CRLH-based hybrid ring (rat-race) coupler and thus lends itself to many dual-band systems and applications. Although the examples describe the use of dual-band operation, it will be appreciated that the same concepts can be utilized for fabricating devices utilizing more than two frequencies. In supporting more than two frequency bands, one may also utilize harmonics of the two fundamental frequencies.

It should be appreciated, in light of the increasing need to create compact electronic devices, that conventional design approaches are not optimal or even sufficient for many applications, as they do not consider size miniaturization and thus leave significant room for improvement. In the present invention, this extended design methodology will be described toward designing dual-band rat-race couplers of a compact size. This design method, along with the measured results of a fabricated coupler (operating at 2.4 GHz and 5.2 GHz by way of example), will be presented in a later section of this paper. Toward demonstrating the applicability of this component, the coupler will be integrated into a compact dual-band front end for a multiple-input multiple-output (MIMO) antenna array.

Multiple-input multiple-output (MIMO) systems have received increased attention in wireless communications due to their attractive capability of linearly increasing capacity with respect to the number of antennas in the transmitter/receiver ends. When used in a transmission mode, the rat-race coupler serves to excite two orthogonal radiation modes, and when used in a receiver mode, the rat-race coupler operates as a mode decoupling network. In this way, use of the rat-race coupler contributes to the antenna pattern diversity of the MIMO system. However, the use of conventional couplers is often limited to operating at a single band since the frequency bands can not be arbitrarily set to suit the majority of applications. In addition, although there has been much effort to make compact dual-band antennas for close space requirements in MIMO applications, there has not been a concerted focus on a compact dual-band front-end element as an integration network for applications.

In a later section, a front-end module including a CRLH-based dual-band compact rat-race coupler and a dual-band compact planar antenna array is presented for compact dual-band MIMO applications. Measured results validate the practicability of utilizing the embodied rat-race coupler in an embodiment of a MIMO module.

2. COMPACT DUAL-BAND RAT-RACE COUPLER

The conventional rat-race coupler consists of three transmission line segments with phase delays $\phi_1=-90°$ and one segment with a delay $\phi_2=-270°$ at the first band $f_1$. Since conventional TLs have phase responses that are linear with respect to frequency, the rat-race couplers can be utilized as dual-band components only at odd multiple frequencies of the first band. For example, $f_2$, the second band of operation, is equal to $3f_1$ for a conventional coupler requiring $\phi_1=-270°$ and $\phi_2=-810°$ in band $f_2$.

As described above, FIG. 1 illustrates a conventional hybrid ring (rat-race) coupler having four ports and whose ring is formed from transmission lines (TLs) of right-handed (RH) microstrip line. In contrast to the conventional rat-race coupler, the present invention teaches rat-race coupler embodiments formed from composite Right/Left Hand (CRLH) TLs. A comparison of TL phase responses for the conventional rat-race coupler and one according to an aspect of the present invention are detailed in Table 1. CRLH TLs have been shown to have non-linear phase responses with respect to frequency, and also demonstrate both phase delay and advance depending on the frequency. These unique properties result from the existence of a series capacitance $C_L$ and a shunt inductance $L_L$, in addition to a series inductance $L_R$ and a shunt capacitance $C_R$, in the equivalent circuit model of a CRLH TL. Moreover, the phase slope can be configured by changing the equivalent circuit parameters ($L_R$, $C_R$, $L_L$, $C_L$). This ability to configure phase characteristics makes arbitrary dual-band operation possible in the present invention. Accordingly, one way to design for arbitrary dual-band operation is to employ TLs with designable non-linear phase responses.

It should be appreciated that the operating frequency bands of the compact hybrid ring need not have any specific relationship, whereby a second frequency band $f_2$ can be in arbitrary relation to a first frequency band $f_1$. By way of example the frequency band $f_1$ is considered the lower operating frequency band, with $f_2$ considered the higher operating frequency band, although they can have any arbitrary relationship. Accordingly, in the compact dual-band hybrid ring of the present invention ring the second band of operation $f_2$ need not be an integer multiple ($n \times f_1$) of the first frequency band $f_1$, and in particular $f_2$ need not be equal to $3f_1$ as results when using a conventional hybrid ring as a dual band coupler.

As already described with regard to FIG. 1, a conventional rat-race coupler 10 is exemplified forming a ring 12, first port 14, second port 16, third port 18 and fourth port 20. The frequency bands of use in the conventional rat-race (hybrid ring) coupler have a relationship of $f_2=3f_1$, with associated phase relationships given at $f_1$: $\phi_1=-90°$, $\phi_2=-270°$, at $f_2$: $\phi_1=-270°$, $\phi_2=-810°$.

In contrast to this the rat-race coupler implemented using the CRLH TLs can have an arbitrary $f_2$, although the radius of this CRLH coupler would be larger than the conventional rat-race coupler, such as by 43.2% at the lower operating frequency, in terms of the guided wavelength. This increase in size largely results from the size of the transmission line section necessary to realize a phase delay equal to −810°. It should be appreciated that previous design methods used only a phase delay less than zero ($\phi_1$, $\phi_2<0$). According to the present invention both phase delay and advance are greater than zero ($\phi_1$, $\phi_2>0$).

In Table 1 the conditions necessary for a general CRLH TL dual-band rat-race coupler have been summarized. In general, $\phi_1$ must be an odd integral multiple of 90° at both $f_1$ and $f_2$, but due to the phase lead/lag property of the CRLH TL, it can be either negative or positive. Additionally, $\phi_2$ is 180° out of phase with $\phi_1$ at $f_1$ and $f_2$.

An embodiment of the compact CRLH hybrid ring coupler according to the invention was created by forcing a constraint on the generalized phase responses of the coupler. In this embodiment the phase responses were constrained to $|\phi_1|$, $|\phi_2| \leqq 270°$, although this limits implementation to only four possible solutions, as shown in Table 2. Each possible solution is implemented utilizing right-handed (RH) microstrip lines and left-handed (LH) lumped elements, such as one, or preferably a plurality of, unit cells having series capacitance and shunt inductance. Finally, the overall size of each design was compared in determining that the most compact design is that of Solution #4 shown in Table 2 operating at $f_1$:(−90°,90° and $f_2$:(−270°, −90°.

Figure 2:
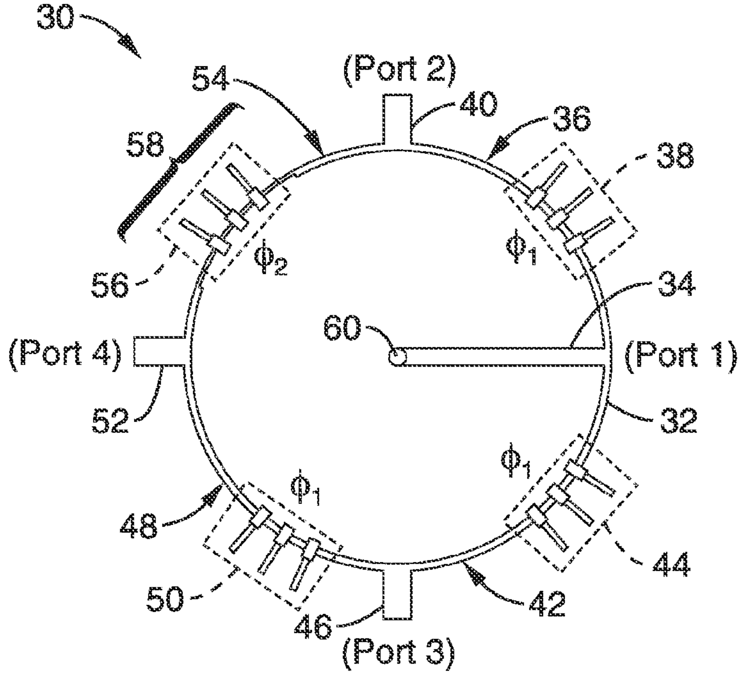
FIG. 2 is a schematic of a compact dual-band hybrid ring (rat-race) coupler according to an embodiment of the present invention.

FIG. 2 is a schematic of an example embodiment 30 of a dual-band hybrid ring (rat-race) coupler. The elements of the coupler are shown by way of example with ring 32, summation port 34 (shown as first port), second port (first output port) 40, third port (second output port) 46, and a difference port 52 (shown as a fourth port). It will be noted that the ports can be numbered in any desired manner. The connection to summation port 34, in this embodiment, is shown by way of example connected by way of a feedthrough connection 60 either to, or through, the substrate (e.g., PCB material).

Sections of the ring, such as seen by 36, 42, 48 and 54, extend between each pair of adjacent ports, each of which contains lumped elements, as represented by dashed boxes 38, 44, 50 and 56 within which are depicted a series of LH cells. It should be appreciated that the lumped elements preferably comprise a series of capacitors and shunt inductors, with the drawing representing three lumped element cells in each segment of the ring. It is preferable that multiple cells (e.g., series capacitor C and shunt inductor L) be utilized in each segment of the ring, while the exact number can be selected is a matter of design choice for the given application. The portions of the ring are labeled in regards to phase relationships as either $\phi_1$ or $\phi_2$. It will also be noted that a section of the ring corresponding to $\phi_2$ is configured with a stepped impedance 58.

Figure 3:
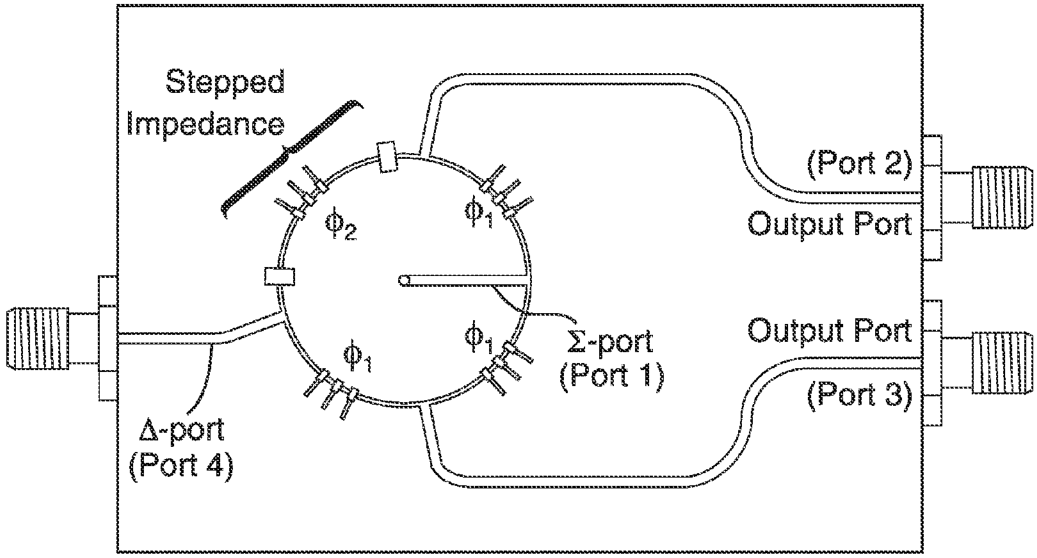
FIG. 3 is an image rendition showing a compact dual-band hybrid ring (rat-race) coupler shown fabricated according to an embodiment of the present invention.

FIG. 3 depicts (as a rendering of a photographic image) the compact dual-band rat-race coupler of FIG. 2, shown fabricated according to the invention, showing a printed circuit board on which has been fabricated TL lines having RH contributions and discrete capacitors and inductors providing the LH TL contributions to the CRLH TL. Segments of the rat-race coupler are shown as either $\phi_1$ comprising three segments, or one segment $\phi_2$ having the stepped impedance.

By way of example and not limitation, the LH circuit parameters for this implementation of the compact dual-band rat-race coupler are: ($L_{L,\phi1}=4.7$ nH, $C_{L,\phi1}=1$ pF) and ($L_{L,\phi2}=15$ nH, $C_{L,\phi2}=3$ pF). The segment corresponding to $\phi_2$ of the embodiment shown incorporates stepped impedance sections toward compensating (e.g., fully or partially) for the self-resonant effect of the lumped elements. According to at least one implementation, each segment of the CRLH TL is symmetrical with identical circuit arrangement as seen from terminals (ports) on either side of a CRLH segment. To provide matching convenience, a preferred implementation is designed to have equal impedance exhibited at each port.

Figure 4A:
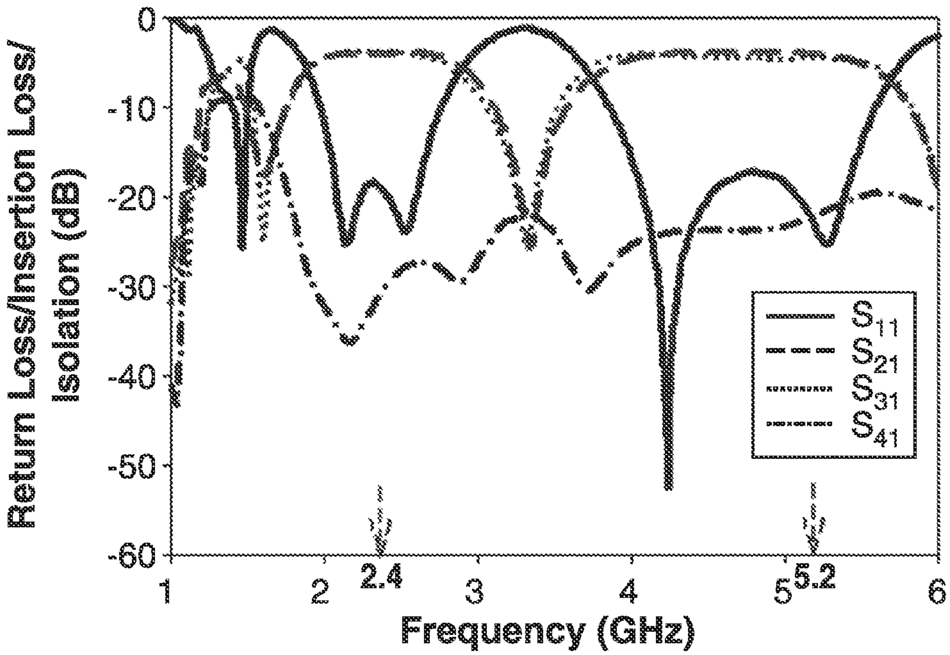
FIGS. 4A-4B are plots of signal loss, isolation, and phase response with respect to frequency for the embodiment of FIG. 3.
Figure 4B:
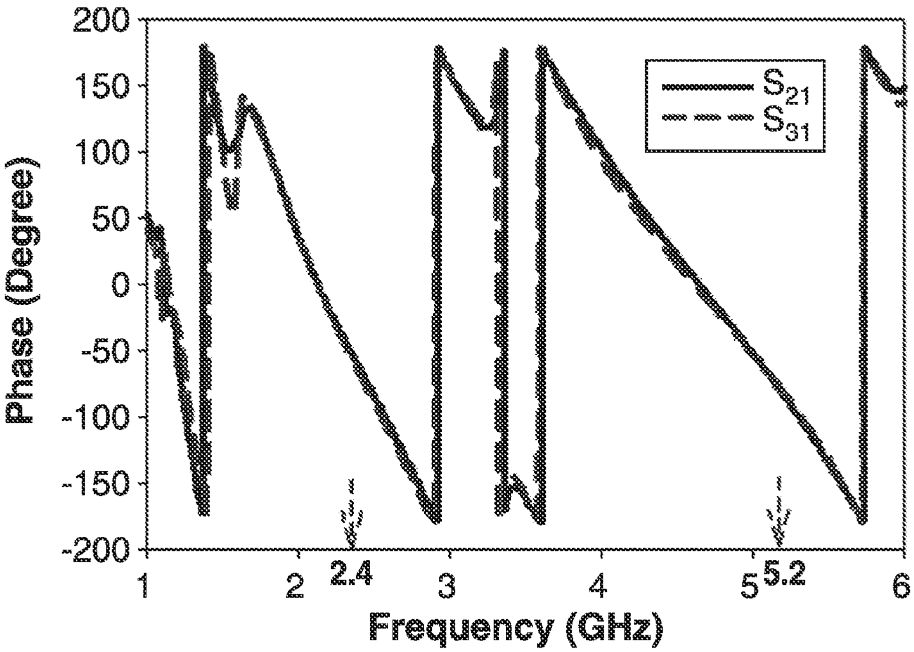

FIGS. 4A and 4B depict measured magnitude and phase response, relative to the sum port (port 1), of the fabricated rat-race coupler shown in FIG. 3. These plots show return loss ($S_{11}$), insertion loss 1 ($S_{21}$), insertion loss 2 ($S_{31}$), and isolation ($S_{41}$), for the compact dual-band hybrid ring coupler shown in FIG. 3. Measured results relative to the difference port (e.g., port 4) are not included here, yet demonstrate similar dual-band characteristics. Table 3 summarizes the performance of the coupler in the two pass bands of 2.4 GHz and 5.2 GHz as per this particular embodiment.

It will be appreciated that embodiments of the present invention can be scaled for operating at various frequency bands with the segments modified for arbitrary frequency relationships between at least two operating frequencies. It can be observed from Table 3 that low levels of magnitude imbalance and phase imbalance are achieved in both bands in addition to high levels of isolation between the sum and difference ports, such as exceeding 20 dB. Moreover, using the design method according to the present invention the proposed dual-band coupler has a radius of 11.26 mm, which results in a 55% reduction in footprint size (device area) when compared to a conventional coupler operating at 2.4 GHz (radius 16.7 mm). These results demonstrate the feasibility of the compact dual-band rat-race coupler, while illustrating that this coupler would be particularly well-suited for use as a front-end within a dual-band MIMO system.

3. COMPACT DUAL-BAND FRONT-END FOR MIMO SYSTEM

As mentioned previously, a rat-race coupler can be utilized to realize pattern diversity in the transmitter end of MIMO systems. In one embodiment, the output ports of the coupler are connected to a two element antenna array. By exciting either the sum port or the difference port, antenna elements create either a sum or a difference radiation pattern. These two radiation modes are orthogonal to each other and thus achieve pattern diversity. On the other hand, this coupler works as a decoupling network in the receiver by splitting two orthogonal radiation modes. In this way, isolation levels can be achieved between the sum and difference ports (the input ports of the system) of the coupler which are critical to supporting the performance of a MIMO system. In this section, the previously discussed dual-band rat-race coupler will be incorporated into a MIMO front-end, which can be significantly reduced in size.

Figure 5:
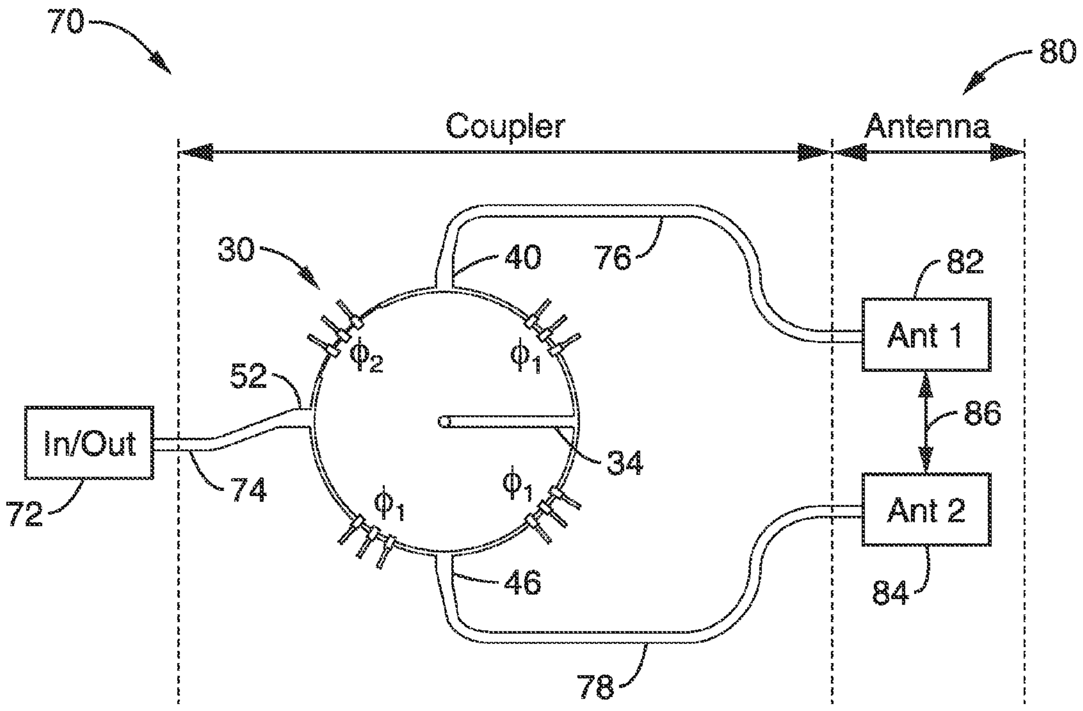
FIG. 5 is a schematic of the compact hybrid ring (rat-race) coupler of FIG. 2, shown as a front end to MIMO antennas according to an embodiment of the present invention.

FIG. 5 is a schematic of an example embodiment 70 of a dual-band hybrid ring (rat-race) coupler as the front end of a dual-band MIMO system. A hybrid ring coupler 30 is shown as shown in FIG. 2 and FIG. 3 with ports 34, 40, 46 and 52, coupled to a MIMO front end 80. Input/output connection 72 with trace 74 is shown coupled to the difference port 52. A first output port 40 is shown coupled by trace 76 to a first antenna 82, while a second output port 46 is shown coupled through trace 78 to a second antenna 84. Antenna elements 82, 84 are shown set to a spacing 86. It should be appreciated that antenna element spacing 86, expressed as a fraction of wavelength (λ), differs for the two bands of operation. Sum port 34 is routed through to the opposite side of the PCB through a feedthrough, therefore the connection for port 34 is not seen in this figure.

Figure 6:
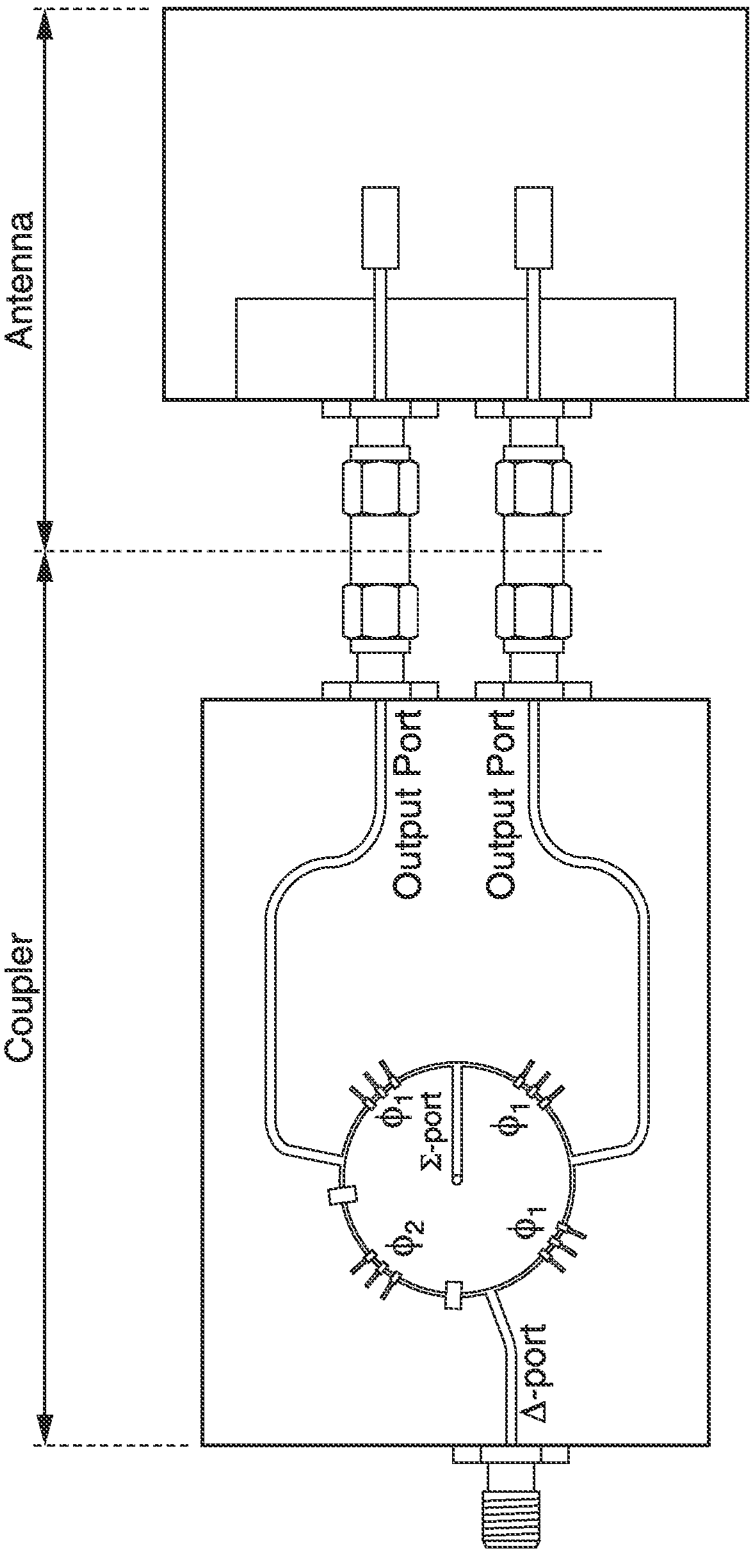
FIG. 6 is an image rendition showing the compact hybrid ring (rat-race) coupler of FIG. 5, shown fabricated according to an embodiment of the present invention.

FIG. 6 depicts (as a rendering of a photographic image) an embodiment of the MIMO front end of FIG. 5, shown fabricated with hybrid ring coupler (left side of the image) connected to a dual-band planar antenna array (right side of the image). In the example embodiment, the antenna elements are spaced apart by 15 mm (around 0.1λ at 2.4 GHz).

Figure 7:
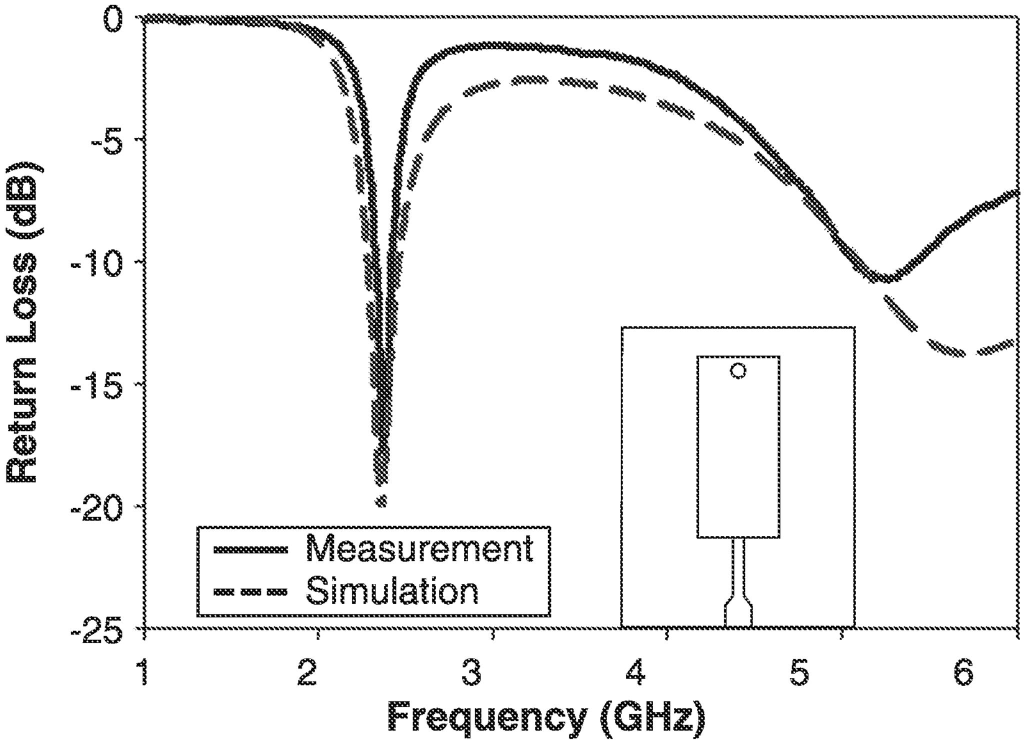
FIG. 7 is a plot of return loss, simulated and measured, with respect to frequency for the compact dual-band planar antenna system shown in FIG. 6.

FIG. 7 depicts simulated versus measured frequency response for the planar antenna used in an antenna configuration shown in the inset image of the figure. This dual-band antenna array is based on MTM Technology™ of Rayspan Corporation™ toward ensuring each compact antenna element delivers efficiencies similar to free space with high MIMO gain and drastically reduced antenna element spacing. In one embodiment, a single-band antenna element has a dipole-like radiation pattern with maximum gain of 2 dBi and a length of 11.2 mm. It should be appreciated that the overall size of the module shown in FIG. 6 can be reduced further by decreasing the length of the output port feed lines and by fabricating the antennas and the coupler on the same board.

Figure 8A:
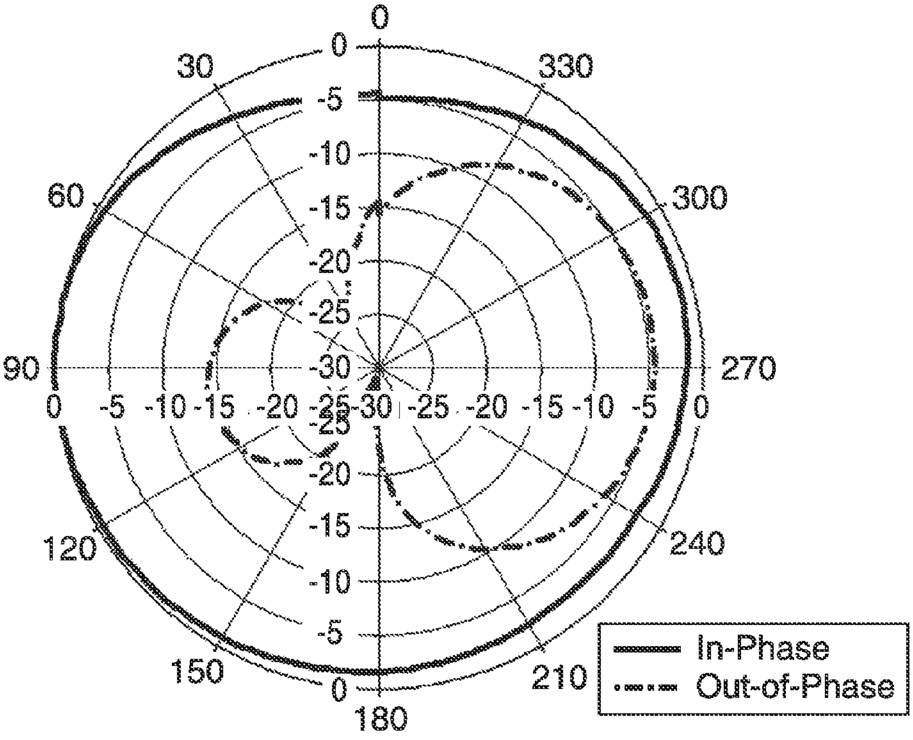
FIGS. 8A-8B are plots of radiation patterns for the MIMO antenna configuration of FIG. 6, shown for outputs at a first frequency and a second frequency.
Figure 8B:
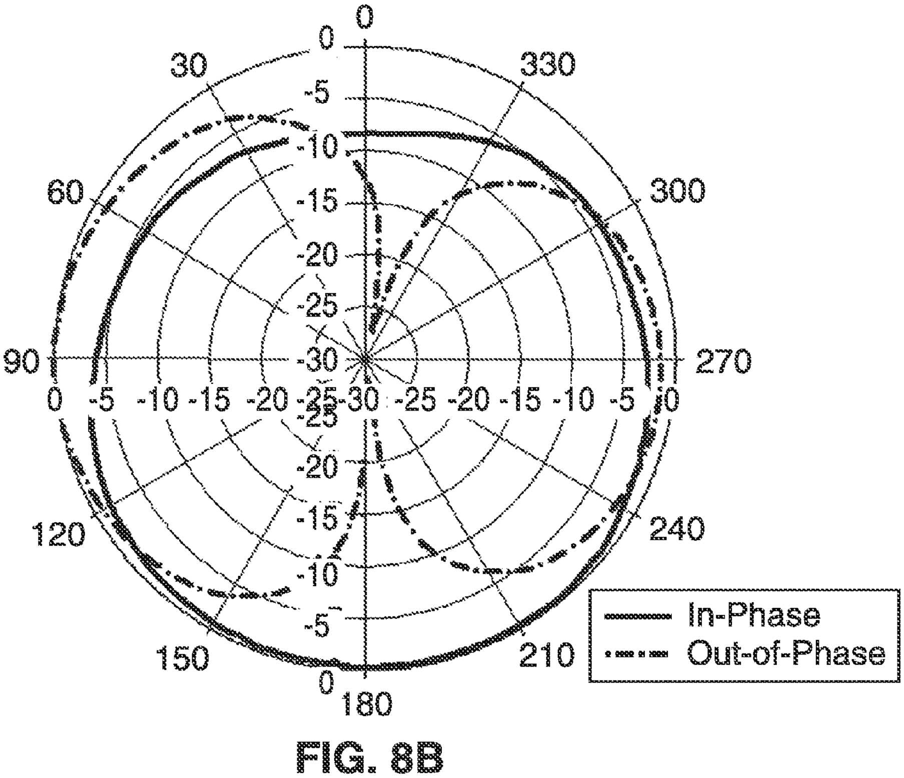

FIGS. 8A and 8B depict radiation patterns showing pattern orthogonality of the transmitting system at 2.4 GHz and 5.2 GHz, respectively. The H-plane patterns remain omni-directional when the array is excited in-phase. Conversely, if the array is excited out-of-phase, the H-plane patterns show nulls in the broadside direction, as expected. The out-of-phase excitation pattern measured at 2.4 GHz, in FIG. 8A, is less symmetrical compared to that at 5.2 GHz, in FIG. 8B, due to the existence of a larger phase imbalance at 2.4 GHz. By reciprocity, the rat-race coupler can also be used as a decoupling network for received orthogonal radiation modes. It should be noted that for the receiving mode, a low correlation is required between the two input ports of the system. It will be appreciated by one of ordinary skill in the art that the embodiment provides good pattern diversity, as it provides sufficient pattern diversity to suit wide ranging applications.

Figure 9:
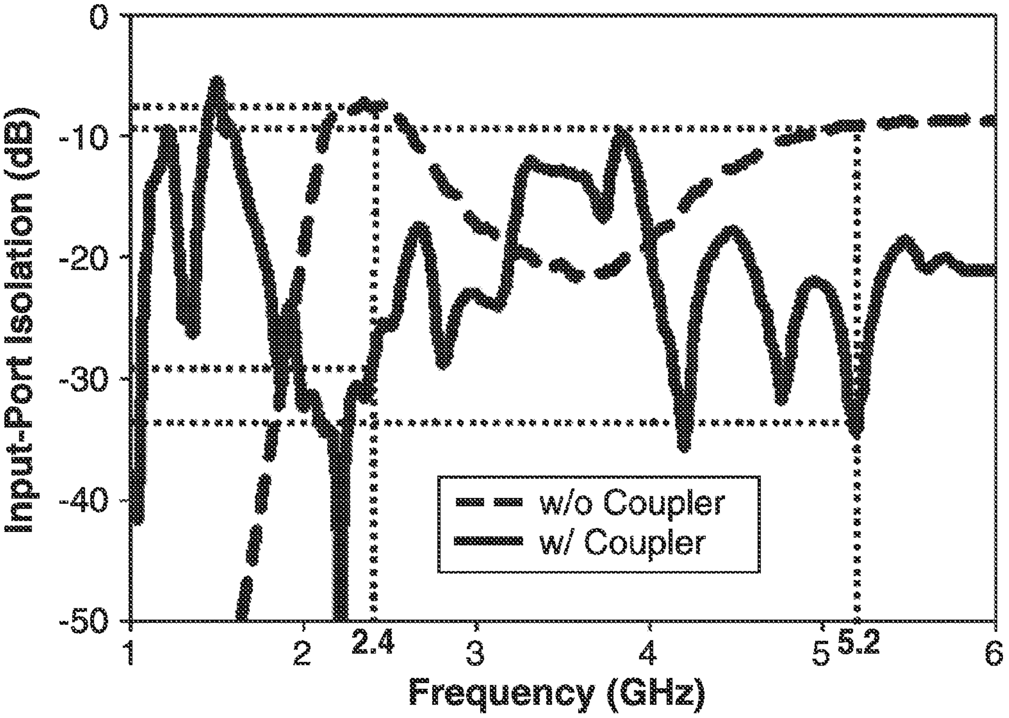
FIG. 9 is a plot of input-output isolation with respect to frequency for the MIMO antenna configuration of FIG. 6, shown for outputs at a first frequency and a second frequency.

FIG. 9 depicts input port isolation of a MIMO antenna array compared without, or with, the coupler. In the first case, the measurement is taken at the input ports of the antenna array. In the second case, the measurement is taken at the input ports of the coupler when the output ports are connected to the antenna array. With the coupler, isolation has improved by 21 dB and 25 dB at 2.4 GHz and 5.2 GHz, respectively, over use without the coupler.

4. METAMATERIAL ANTENNA

Embodiments discussed above as well as the inset of FIG. 7 describe the use of a metamaterial (MTM) antenna array coupled to the CRLH hybrid ring coupler. The MTM antenna array structure can be adapted and designed to provide one or more advantages over other antennas, such as compact size, multiple resonances based on a single antenna solution, resonances that are stable and do not shift substantially with the user interaction, and resonant frequencies that are substantially independent of physical size. Furthermore, elements in an MTM antenna array structure according to embodiments described herein can be configured to achieve desired bands and bandwidths based on the CRLH properties. The implementations and analyses of MTM antenna structures are described in related U.S. patent application Ser. No. 11/741,674 filed on Apr. 27, 2007, published as publication number US 2008/0258981 A1 on Oct. 23, 2008, entitled "Antennas, Devices and Systems Based on Metamaterial Structures," and in U.S. patent application Ser. No. 11/844,982 filed on Aug. 24, 2007, published as publication number 2008/0048917 A1 on Feb. 28, 2008, entitled "Antennas Based on Metamaterial Structures," each of which is incorporated herein by reference in its entirety.

An MTM antenna is configured with one or more metamaterial unit cells. The equivalent circuit for each metamaterial unit cell includes a right-handed series inductance (LR), a right-handed shunt capacitance (CR), a left-handed series capacitance (CL), and a left-handed shunt inductance (LL).

The contributions of LL and CL are structured and connected to provide the left-handed (LH) properties to the unit cell. The bandwidth of LH resonances can be increased, for example, by reducing the right-handed shunt capacitance CR. This CR reduction can be achieved, for example, through the use of a truncated ground in the structure.

One type of MTM antenna structure comprises a single-layer metallization (SLM) MTM antenna structure, which has conductive parts of the MTM structure in a single metallization layer formed on one side of a substrate. A two-layer metallization via-less (TLM-VL) MTM antenna structure is of another type which can be generally characterized by the inclusion of two metallization layers on two parallel surfaces of a substrate with the use of a conductive via to connect one conductive part in one metallization layer to another conductive part in the other metallization layer. Example implementations of the SLM and TLM-VL MTM antenna structures are described in related U.S. patent application Ser. No. 12/250,477 filed on Oct. 13, 2008, entitled "Single-Layer Metallization and Via-Less Metamaterial Structures," incorporated herein by reference in its entirety.

5. METAMATERIAL BEAM PATTERN DIVERSITY

The limitations on achieving dual-band operation in pattern diversity systems generally stems from the coupler used as a mode decoupling network. It should be appreciated that conventional couplers can be used as dual-band components only at odd multiple frequencies of the first band. This limitation arises because conventional TLs have phase responses that are linear with respect to frequency. The present invention, toward achieving arbitrary dual-band operation, employs TLs with designable non-linear phase responses.

In an earlier section a compact dual-band rat-race coupler based on metamaterial TLs was taught and further integrated as a decoupling network into a compact dual-band pattern diversity system. By exciting either the sum or difference port, the two-element antenna array is capable of exhibiting two orthogonal radiation modes. Radiation at both frequencies presents the same type of diversity, through sum and difference patterns. However, in certain applications, other radiation patterns are desired, such as endfire radiation patterns may be preferable. The following portions of the specification address this need.

In the following, a situation is considered in which the endfire patterns are obtained in the higher band while the sum/difference modes are maintained in the lower band. It is proposed to employ a CRLH-based phase delay line at the output of the coupler with specific phase delay (0°, −90° at two operational frequencies (2.4 GHz, 5.2 GHz) respectively. The presence of this phase delay line configures the proposed beam pattern diversity system to generate a set of endfire patterns in the higher band with a predetermined antenna element distance such as λ/4 (¼ wavelength) in addition to having broadside patterns at the lower frequency. Furthermore, as will be shown in a later section, a CRLH-based phase delay line can be used to compensate for phase imbalance at the outputs of the coupler, which contributes to improved directivity.

In this section of the present invention a compact beam pattern diversity module includes a compact CRLH-based dual-band rat-race coupler, a CRLH-based phase delay line, and an antenna array such as a compact dual-band planar antenna array. The operating principle of the overall system is elaborated, design methodology and implementation described, and measured results outlined to validate practicality of the compact rat-race coupler and phase delay line to control beam formation in the embodied pattern diversity system.

6. OPERATION OF DB BEAM PATTERN DIVERSITY SYSTEM

As described in a previous section, a CRLH-based rat-race coupler can be beneficially employed as a (radiation) mode decoupling network. The utilization of the CRLH-based phase delay line introduces differential levels of phase delay between the hybrid ring coupler and an antenna array coupled to the hybrid ring. In one implementation, additional phase delay is introduced in one path relative to the other path from the output of the dual-band rat-race coupler. By way of example and not limitation, no phase delay is introduced into a first frequency band (e.g., the lower band), while a predetermined phase delay is introduced into a second frequency band (e.g., the higher band). Therefore, the dual-band rat-race coupler combined with the phase delay line provides the array elements with equal magnitude and tunable phase excitation. This aspect of the invention enables the overall system to have more than only sum and difference radiation modes.

FIG. 10A through FIG. 11B illustrate an embodiment 90 of the pattern diversity system comprising a CRLH hybrid ring, depicted as compact rat-race coupler 30, a CRLH-based phase delay line structure 92, and a dual-band planar antenna array 80, having elements 82, 84. By way of example, and not limitation, the antenna element spacing 86 is 15 mm, which is λ/4 for a 5.2 GHz operating frequency. The phase delay line is added at the output/input of this dual-band rat-race coupler/antenna array.

Figure 10A:
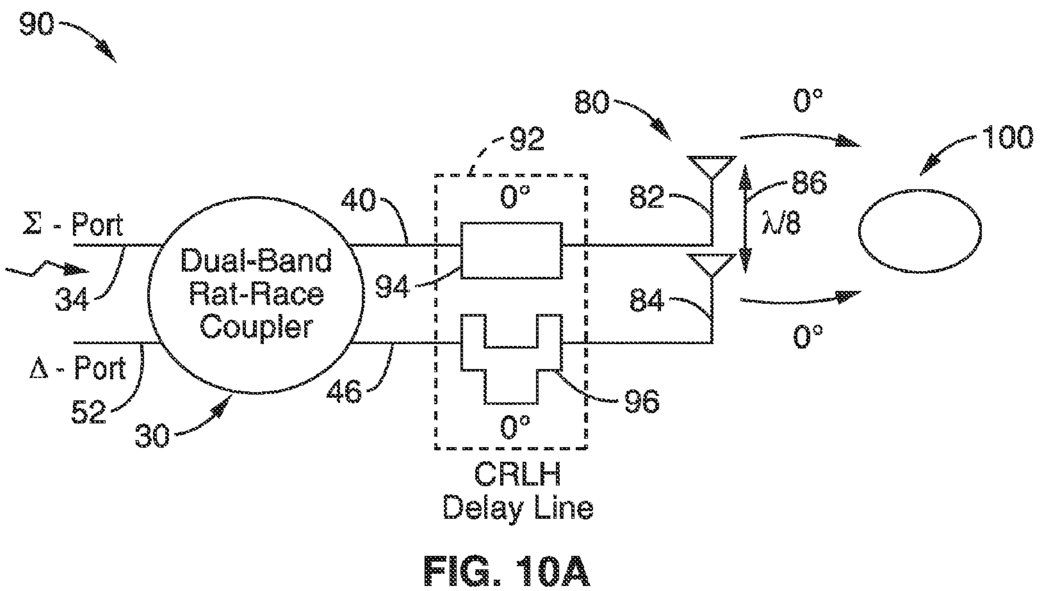
FIGS. 10A-10B are schematics of a dual-band beam pattern diversity system according to an embodiment of the present invention and shown operating at a first operating frequency band in response to a first and second excitation mode.
Figure 10B:
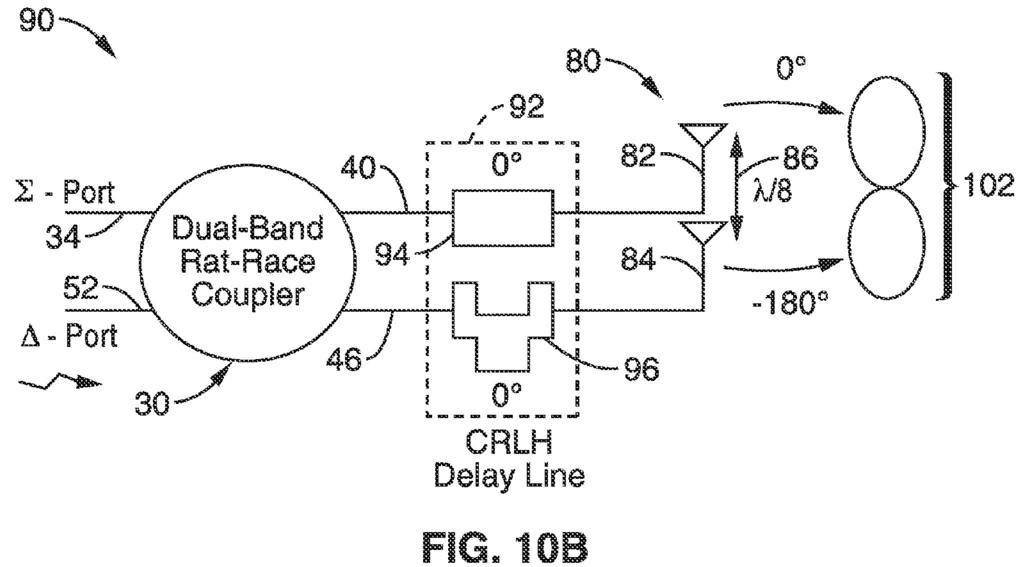

In FIGS. 10A-10B the dual-band beam pattern diversity system is represented as operating in the lower band (2.4 GHz) with sum port excitation 34 depicted in FIG. 10A and difference port 52 excitation in FIG. 10B. Outputs 40, 46 from dual-band rat-race (DB RR) coupler 30 connect to a phase delay line structure 92 having a first TL segment 94 which does not require a CRLH phase delay contribution, and a second delay line TL segment 96 which includes a CRLH phase delay contribution. It should be appreciated that both TL segments are subject to temporal delay, but it is the relative phase delay contribution of one or both of the TLs in the phase delay line which are of most interest in the discussed pattern diversity system. Outputs from the phase delay line structure 92 are coupled to an antenna array 80, which in this example embodiment comprises first antenna 82 and second antenna 84, between which there is a spacing 86, such as λ/8 in this first frequency band. At this first operating frequency band, the CRLH phase delay line structure 92 does not introduce extra phase discrepancy between the two paths passing through phase delay line structure 92 and thus the excitation currents for array elements are either in-phase or out-of-phase as indicated in the outputs 100, 102 shown in FIG. 10A or 10B, respectively.

It should be appreciated that the antenna element distance under this condition is not crucial in the sense that it does not affect the beam pattern and thus the antenna array can be configured in consideration of overall system miniaturization. Therefore, sum and difference radiation modes are observed at 2.4 GHz. This working principle applies to both frequencies for the hybrid ring coupler system described in prior sections in which no CRLH phase delay line is inserted.

Figure 11A:
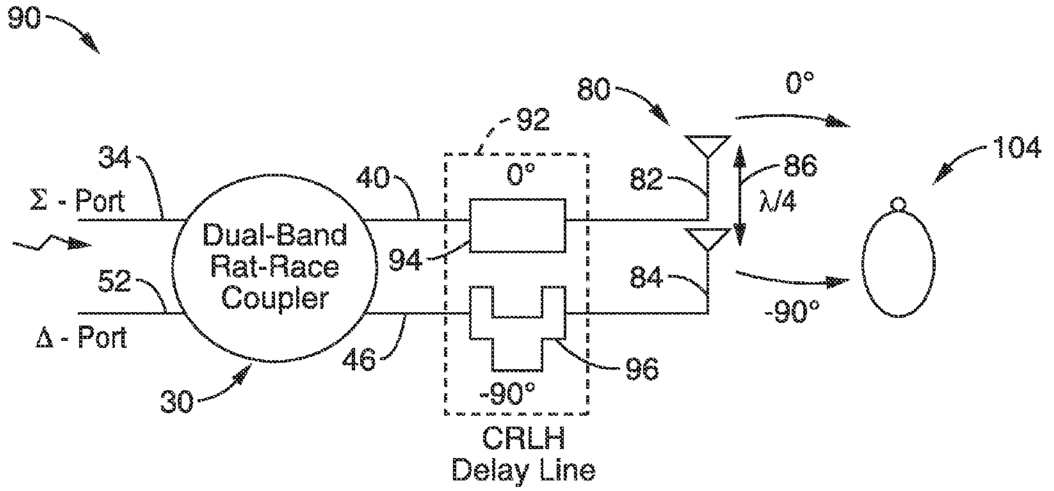
FIGS. 11A-11B are schematics of the dual-band beam pattern diversity system of FIG. 10A-10B shown operating at a second operating frequency band in response to a first and second excitation mode.
Figure 11B:
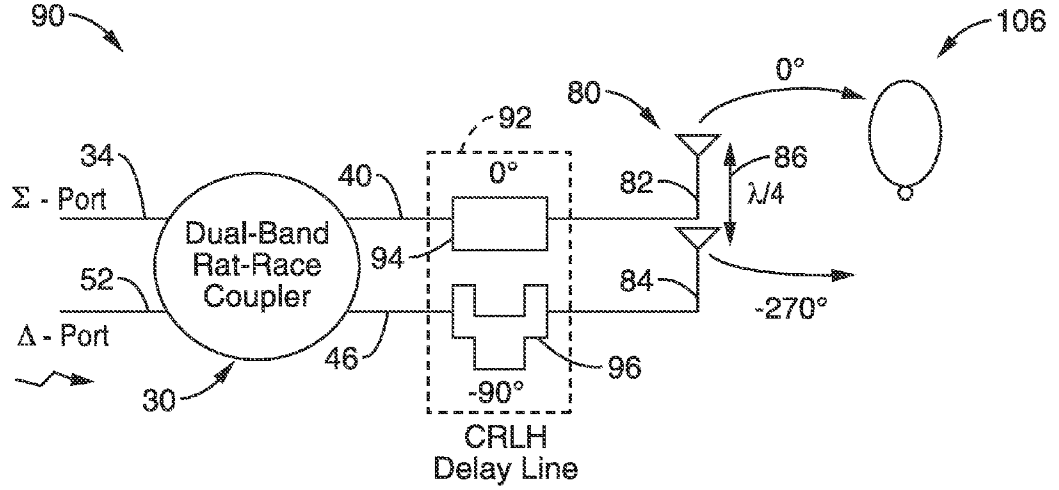

FIGS. 11A-11B, however, illustrates CRLH-based phase delay line structure 92 of embodiment 90 having a phase progression 90° in the lower path connected from the output port of the coupler with respect to the upper path at 5.2 GHz.

In this case the excitation signals at the input ports of the two-element array 80 with antennas 82, 84 are with equal magnitude and quadrature phase difference. The antenna element spacing 86 in free space is λ/4 at this frequency, which is equivalent to 90° phase difference for waves originating from one element to the other. The quadrature path difference along with the quadrature phase excitation between the array elements causes the system to have the endfire radiation beams. Depending on sum or difference port excitation, the main beams are oriented in opposite directions. This can be readily seen in the output patterns 104, 106 of FIGS. 11A-11B, showing beam orientation for each excitation in the higher operational band. Because these beams are pointed in opposite directions, the radiation modes can be regarded as orthogonal.

The incorporation of the CRLH phase delay line in the embodied pattern diversity system provides increased design flexibility. It should be appreciated that utilizing the decoupling network, such as the rat-race coupler described in a previous section, without the phase delay line results in the generation of similar orthogonal radiation sets at the dual frequencies. In contrast to this, the response generated when the additional 90° phase delay is introduced by the delay line leads to a new beam pattern diversity system with a new set of radiation patterns, such as the opposite endfire patterns, with respect to the two different frequency bands.

Additional benefits from the phase delay line arise in that the phase delay at the two individual frequencies can be adjusted slightly in order to compensate for the phase imbalance of the coupler toward achieving improved directivity. Furthermore, it can be shown that by employing CRLH-based components, such as the dual-band rat-race coupler and the phase delay line, the beam pattern diversity system can operate at arbitrary dual bands of interest.

7. COMPONENTS OF DB BEAM PATTERN DIVERSITY SYSTEM

A. Compact Dual-Band CRLH-Based Rat-Race Coupler.

In the present invention CRLH TLs are utilized for implementing an arbitrary dual-band hybrid ring (rat-race) coupler with controllable non-linear phase responses, as described in prior sections. The CRLH TLs demonstrate both phase delay and advance depending on the frequency and circuit parameters of the structure (LR, CR, LL, CL). Furthermore, the phase slope can be configured by changing these equivalent circuit parameters. In contrast to this, it should be appreciated that conventional TLs have a linear phase response with respect to frequency.

In addition, toward arriving at a miniaturized dual-band rat-race coupler, both phase delay and advance have been considered in the present invention. It can be shown in the dual-band applications shown that four possible phase combinations arise within the phase limitation $|\phi_1|$, $|\phi_2| \leqq 270°$. The optimal solution in these dual-band applications is then generally considered that which renders the most compact overall configuration, which is as described utilizing right-handed (RH) microstrip lines and left-handed (LH) lumped elements. This compact dual-band hybrid ring coupler, previously shown in FIG. 3 was implemented within a dual beam pattern diversity system.

B. CRLH-Based Phase Delay Line.

In order to generate different sets of radiation patterns at dual operational frequencies, a phase delay line based on CRLH TLs is utilized, such as having (0°, −90° phase delay at (2.4 GHz, 5.2 GHz) respectively, to provide the antenna array with equal magnitude and quadrature phase excitation at the higher operational frequency in addition to in-phase or out-of-phase current excitation generated using the dual-band rat-race coupler. The inclusion of a CRLH-based phase delay line with the compact rat-race coupler results in a new mode decoupling network, which combines properties of a rat-race coupler and a branch-line coupler at distinct frequencies. In a first frequency band (e.g., the lower band), the decoupling network feeds the antenna array with in-phase or out-of-phase excitation as consistent with a rat-race coupler, while at a second frequency band (e.g., the higher band) the output ports are excited with quadrature phase difference which is similar to that provided by a single branch-line coupler. Therefore, sets of sum/difference and endfire radiation patterns can be generated respectively at dual frequencies. Moreover, due to the possible phase imbalance from the fabricated coupler, the presence of the phase delay line provides the system with the tuning ability for phase compensation, which contributes to better pattern directivity.

Figure 12:
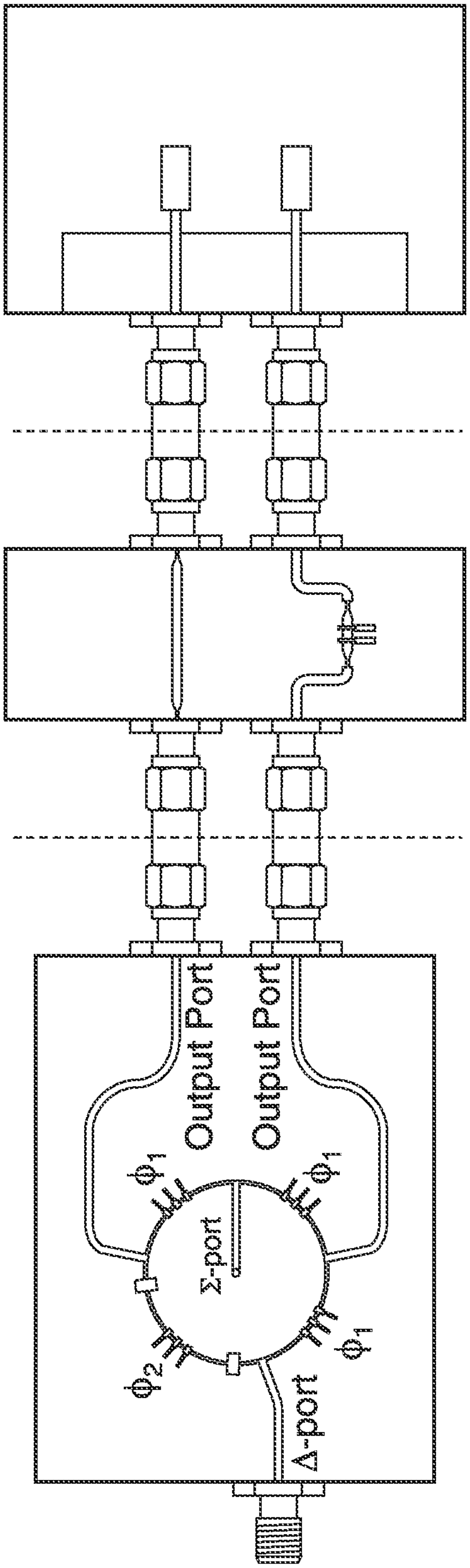
FIG. 12 is an image rendition showing the compact hybrid ring (rat-race) coupler connected through a CRLH phase delay line to two antennas according to an embodiment of the present invention.

FIG. 12 illustrates a phase delay line section coupled between the hybrid ring coupler and a pair of antennas set at a fixed wavelength distance. The compact dual-band hybrid ring coupler in the two pass bands provides low magnitude and phase imbalance, as well as sufficiently high levels of isolation between the sum and difference ports to suit a number of practical applications, and which have been observed at both of the dual frequency bands. The small size and beneficial characteristics, as measured, make this compact dual-band rat-race coupler particularly well-suited as the mode decoupling network in the beam diversity module since these responses influence system ability to generate desired pattern diversity.

In FIG. 12 the CRLH-based phase delay line is shown implemented in a test configuration as a pair of TLs comprising a conventional microstrip line (upper) and a CRLH TL (lower) implemented using RH microstrip lines and LH lumped elements. The LH circuit parameters used in the phase delay line are: ($L_{L,delay}$=6.9 nH, $C_{L,delay}$=2.75 pF). It will be appreciated that phase delay line configurations for coupling to the CRLH hybrid ring may utilize LH lumped elements in either, or both of the TLs, depending on the desired phase relationships.

It should also be appreciated that although the CRLH phase delay line is shown in FIG. 12 in a test configuration with separate “modules” for the hybrid ring coupler, phase delay line, and antenna array; these elements may be integrated with one another to any desired integration level. For example, the hybrid ring coupler, phase delay line, and the antenna array may be implemented within a single device, or even on a single substrate (e.g., printed circuit board). Alternatively, the hybrid ring and phase delay line may be integrated and coupled to a separate antenna array. As another alternative, the phase delay line may be incorporated into the antenna array. Based on these teachings, one of ordinary skill in the art can implement different levels of integration without departing from the present invention.

In the embodiment shown, the phase lags of the CRLH TL with respect to the conventional microstrip line are 0° and −90° at 2.4 GHz and 5.2 GHz respectively. By way of example and not limitation, these lines have a characteristic impedance of 50 ohms to minimize impedance mismatch from coupler output. It should be appreciated that the elements can be generally configured across any of a wide range of impedances to suit a variety of systems.

Figure 13:
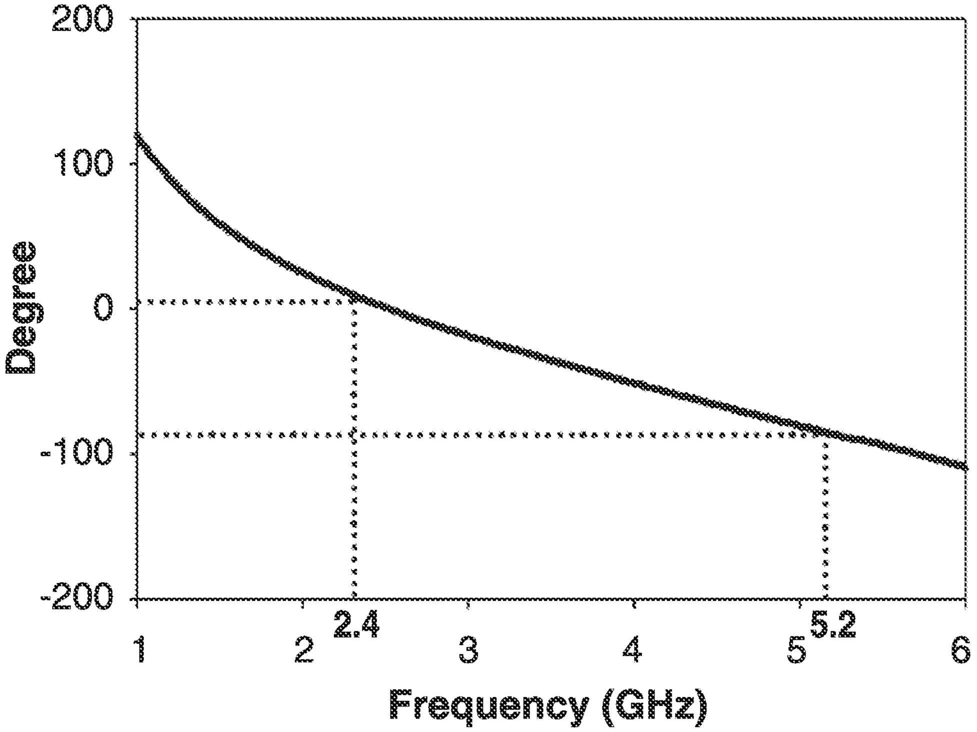
FIG. 13 is a plot of phase differences for a CRLH TL in comparison with a conventional microstrip line.

FIG. 13 depicts measured phase differences between two TLs comprising the phase delay line. It should be appreciated that the phase differences at these two operational frequencies can be adjusted in order to compensate for any phase imbalances from the output ports of the dual-band rat-race coupler.

C. Dual-Band Beam Pattern Diversity System.

The overall pattern diversity system includes a compact CRLH-based dual-band rat-race coupler, a CRLH-based phase delay line, and a dual-band two-element planar antenna array, such as shown with element distance 15 mm (λ/4 at 5.2 GHz). The phase delay line adds extra phase delay of 0° and −90° respectively at dual frequencies to the lower path with respect to the upper one.

Figure 14A:
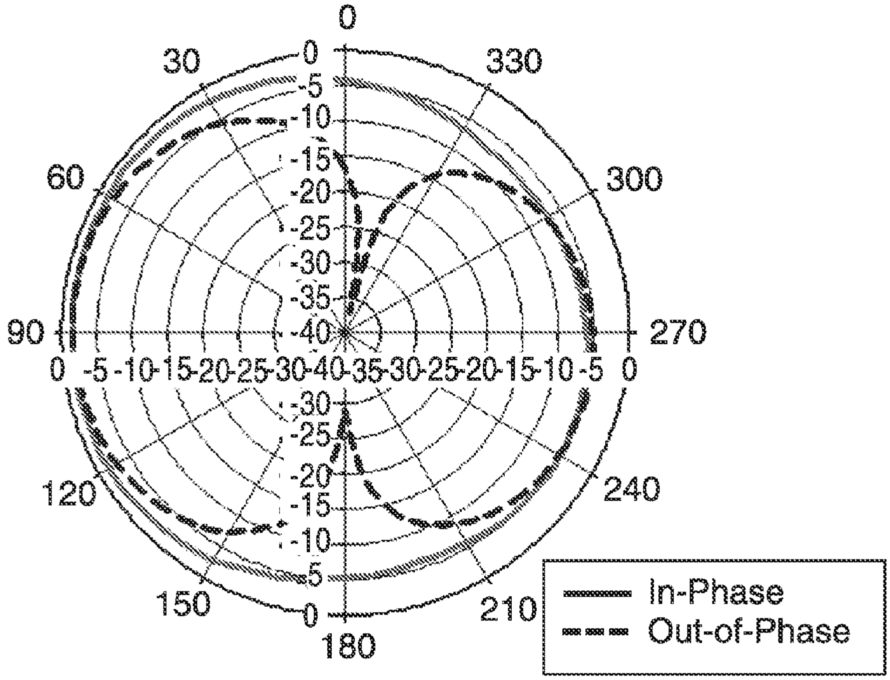
FIGS. 14A-14B are plots of measured H-plane radiation patterns of the beam pattern diversity system of FIG. 12, showing response at 2.4 GHz and 5.2 GHz.
Figure 14B:
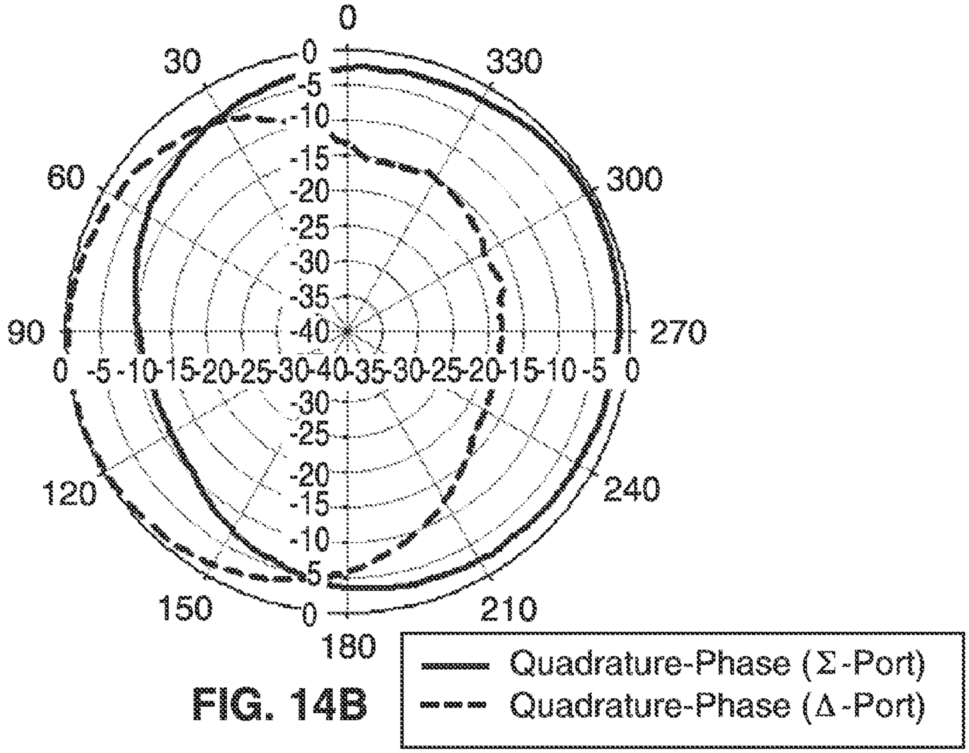

FIGS. 14A-14B depict measured H-plane radiation patterns of the beam diversity system at a first and second frequency band respectively. In FIG. 14A the beam pattern is shown for an embodiment operating at a lower frequency band of 2.4 GHz. It should be seen from the figure that the measured H-plane patterns remain omni-directional (sum radiation mode) when the array is excited in-phase. On the contrary, if the array is excited out-of-phase, the H-plane pattern exhibits nulls in the broadside direction (difference radiation mode). Since these two radiation modes are orthogonal to each other they thus achieve pattern diversity. At the higher frequency band, the excitation currents at the input ports of the antenna array have quadrature phase difference and equal magnitude. Therefore, when the element spacing is λ/4, the radiation patterns exhibits the endfire patterns as seen in FIG. 14B for the 5.2 GHz frequency band. This set of endfire radiation patterns provide maximum beams in opposite directions and thus create pattern diversity in this higher frequency band. Pattern directivity of quadrature-phase excitation from the summation (Σ) port is less obvious because the phase deviation from out-of-phase requirement at the backward direction is larger from the summation (Σ) port. It will be appreciated that fine tuning of the phase delay line can be employed for reducing this deviation.

Figure 15:
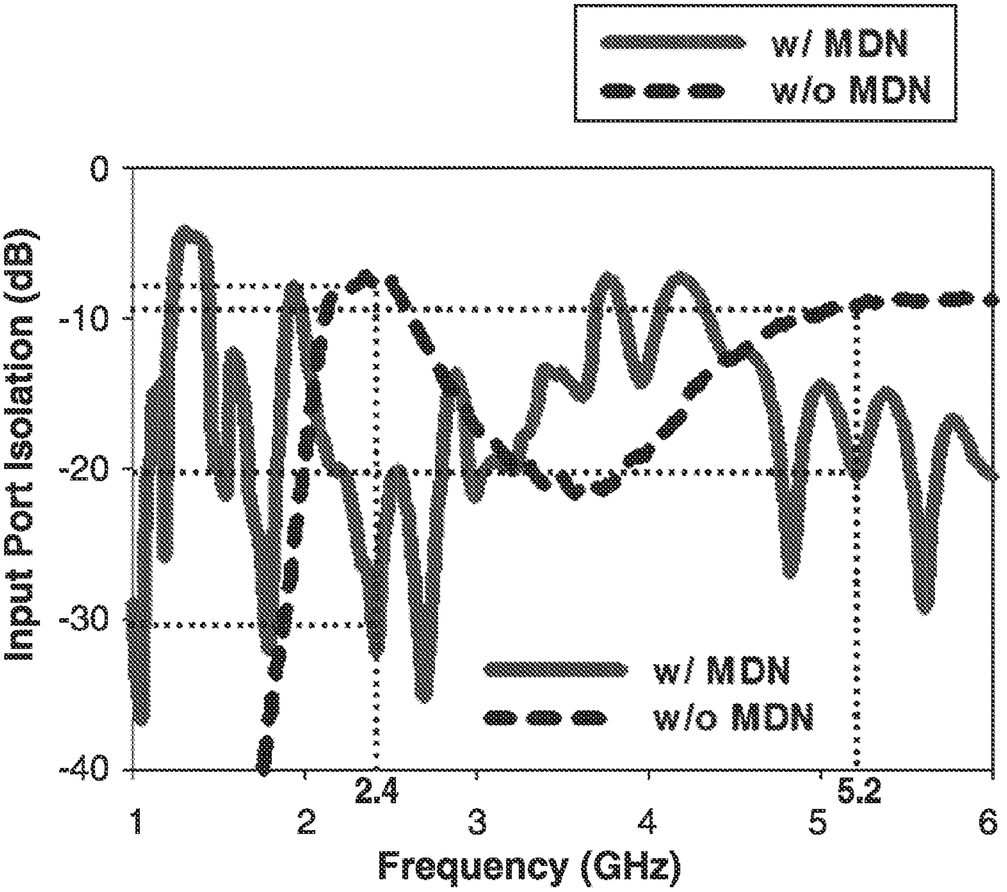
FIG. 15 is a plot of measured improvement of input port isolation for a dual band antenna array in response to whether or not the mode decoupling network (MDN) described by the CRLH hybrid ring coupler and CRLH phase delay line are incorporated.

FIG. 15 depicts measured input port isolation improvement comparing use or non-use of the mode decoupling network (MDN) described above. One plot showing isolation of the antennas by themselves, the other showing the isolation at the input of the MDN which comprises the rat-race coupler together with the phase delay line for splitting orthogonal radiation modes. Toward providing this decoupling it is necessary to have a low correlation between the two input ports of the system. The solid line in the plot depicts feeding the signals directly to the input ports of the antenna array. The dotted line in the plot of FIG. 15 is shown taken at the input ports of the MDN when the output ports are connected to the antenna array. These measurements illustrate that the use of MDN provide an isolation improvement of 22.6 dB and 11.2 dB at 2.4 GHz and 5.2 GHz respectively, from the first case to the second case.

8. CONCLUSIONS

A method and apparatus are described from which a compact dual-band rat-race coupler can be implemented utilizing CRLH TLs whose phase can be configured toward optimized size miniaturization. One embodiment of a dual-band CRLH rat-race coupler according to the present invention shows a 55% size reduction over a conventional rat-race coupler configured for operation at the lower frequency $f_1$. When used in a dual-band MIMO system application, the integration of the coupler combined with a compact planar antenna array contributes to good pattern diversity and improvement of the input port isolation as a mode-decoupling network. Measured results validate the feasibility and benefits of utilizing the inventive coupler within a compact dual-band MIMO system.

In one embodiment a CRLH phase delay line is used with the CRLH hybrid ring coupler within a dual-beam pattern diversity system to provide a frequency dependent phase change, so that a phase difference is introduced between the coupler and antenna for the two different frequency bands. The system is configured to present sum/difference radiation modes at a first frequency band (e.g., 2.4 GHz) while providing different radiation patterns (e.g., endfire radiation patterns) at a second frequency band (e.g., 5.2 GHz). In addition, the presence of the phase delay line adds design flexibility by compensating for phase imbalance from the coupler. When used in a receiver-end, the combination of proposed phase delay line and coupler operates as a mode decoupling network (MDN) which improves input port isolation. Measured results validate the feasibility and benefits of the proposed components in a compact dual-band beam pattern diversity system.

As can be seen, therefore, the present invention includes the following inventive embodiments among others:

1. An apparatus for coupling microwave signals at dual frequency bands, comprising:

(a) a ring of composite right/left-handed (CRLH) transmission line (TL) material having both right handed (RH) and left handed (LH) characteristics;

(b) a plurality of lumped elements comprising inductances and capacitances within said LH portions of said CRLH TL; and (c) a plurality of ports, including a sum port and a difference port, on said ring separated along a periphery of said ring by either phase $\phi_1$, or phase $\phi_2$, to form a hybrid ring coupler;

wherein dual frequency characteristics of each segment of said CRLH TL arise in response to an anti-parallel relationship between phase and group velocities below a transition frequency $\omega_0$, within left handed material (LH) within the CRLH TL, and a parallel relationship between phase and group velocities above transition frequency $\omega_0$ within the right-handed material (RH) within the CRLH TL; and said ring is compacted into a compact ring in response to constraining phase delay contributions to $|\phi_1|$, $|\phi_2| \leqq 270°$, and said ring is configured to operate in at least two frequency bands comprising a first frequency band $f_1$ and a second frequency band $f_2$.

2. An apparatus as recited in embodiment 1, wherein said apparatus provides arbitrary dual-band operation wherein $f_2$ need not be equal to $3f_1$ in response to utilizing TL segments with designable non-linear phase responses.

3. An apparatus as recited in embodiment 1, wherein said compact ring has a smaller diameter than a conventional hybrid ring which is configured for operation at the lower of the frequency bands and which lacks left handed (LH) phase contributions in response to inclusion of lumped elements.

4. An apparatus as recited in embodiment 1:

wherein $\phi_1$ is an odd integral multiple of 90° at both $f_1$ and $f_2$, with $\phi_1$ either negative or positive in response to phase lead or lag properties of the CRLH TL; and wherein $\phi_2$ is 180° out of phase with $\phi_1$ at $f_1$ and $f_2$.

5. An apparatus as recited in embodiment 1, wherein the hybrid ring coupler operates with phases $\phi_1$, $\phi_2$, or $\phi_2$, $\phi_1$) adjusted to (−90°,90° in frequency band $f_1$ and (−270°, −90° in frequency band $f_2$.

6. An apparatus as recited in embodiment 1, wherein said LH portion further comprises stepped impedance sections in the TL segment corresponding to phase advance $\phi_2$, said stepped impedance sections tuned toward compensating for self-resonant effects of the lumped elements.

7. An apparatus as recited in embodiment 1, wherein each port is configured with the same port impedance.

8. An apparatus as recited in embodiment 1, wherein apparatus is configured for operation through a microwave frequency range, with transition frequency $\omega_0$ at or above approximately 100 MHz.

9. An apparatus as recited in embodiment 1:

wherein each segment of said ring of composite right/left-handed (CRLH) transmission line (TL) material comprises a right-handed (RH) TL section in combination with a left-handed (LH) TL section; and wherein the LH TL section is configured with a capacitor of value C and shunt inductors of value L, or an alternating series of capacitors and inductors, coupled to one or more RH TL portions.

10. An apparatus as recited in embodiment 1, wherein said hybrid ring coupler is configured as the front end for a multiple-input multiple-output (MIMO) antenna array.

11. An apparatus as recited in embodiment 1:

wherein said hybrid ring coupler is configured as a front end for a multiple-input multiple-output (MIMO) antenna array; and wherein a first antenna element of said MIMO antenna array is coupled to a first port of said apparatus, and a second antenna element of said MIMO antenna array is coupled to a second port of said apparatus.

12. A system, comprising:

(a) a ring of composite right/left-handed (CRLH) transmission line (TL) material having both right handed (RH) and left handed (LH) characteristics;

(b) a plurality of lumped elements comprising inductances and capacitances within said LH portions of said CRLH TL;

(c) a plurality of ports, including a first input/output port, a second input/output port, a sum port, and a difference port, on said ring separated along a periphery of said ring by either phase $\phi_1$, or phase $\phi_2$, to form a hybrid ring coupler;

said ring is compacted into a compact ring in response to constraining phase delay contributions to $|\phi_1|, |\phi_2| \leqq 270°$;

wherein dual frequency characteristics of each segment of said CRLH TL arise in response to an anti-parallel relationship between phase and group velocities below a transition frequency $\omega_0$, within left handed material (LH) within the CRLH TL, and a parallel relationship between phase and group velocities above transition frequency $\omega_0$ within the right-handed material (RH) within the CRLH TL;

said ring configured to operate in at least two frequency bands comprising a first frequency band $f_1$ and a second frequency band $f_2$;

(d) a MIMO antenna array having a first antenna element to said first input/output port, and a second antenna element coupled to said second input/output port;

wherein signal excitation of either said sum port or said difference port generates a sum or a difference radiation pattern, on said first antenna element and said second antenna element, with said sum or difference radiation patterns having pattern diversity in response to being orthogonal to each other.

13. A system as recited in embodiment 12:

wherein $\phi_1$ is an odd integral multiple of 90° at both $f_1$ and $f_2$, with $\phi_1$ either negative or positive in response to phase lead or lag properties of the CRLH TL; and wherein $\phi_2$ is 180° out of phase with $\phi_1$ at $f_1$ and $f_2$.

14. A system as recited in embodiment 12, wherein the hybrid ring coupler operates with phases $(\phi_1, \phi_2)$ or $(\phi_2, \phi_1)$ adjusted to (−90°,90° in frequency band $f_1$ and (−270°, −90° in frequency band $f_2$.

15. A system as recited in embodiment 12, wherein said LH portion further comprises stepped impedance sections in the TL segment corresponding to phase advance $\phi_2$, said stepped impedance sections are tuned toward compensating for self-resonant effects of the lumped elements.

16. A system as recited in embodiment 12, further comprising:

a CRLH-based phase delay line coupled between said ring of CRLH material and said MIMO antenna array; and wherein said CRLH-based phase delay line is configured for introducing a first phase delay at a first frequency band, and a second phase delay at a second frequency band, which extends pattern diversity to be frequency band dependent which extends pattern diversity of said apparatus beyond sum and difference within the hybrid ring coupler.

17. A system as recited in embodiment 12, further comprising:

a CRLH-based phase delay line coupled between said ring of CRLH material and said MIMO antenna array;

wherein said CRLH-based phase delay line is configured for introducing a first phase delay at a first frequency band, and a second phase delay at a second frequency band; and wherein an endfire radiation pattern is generated in response to the phase delay introduced by said CRLH-based phase delay line and distance between antenna elements.

18. A system as recited in embodiment 12, further comprising:

a CRLH-based phase delay line coupled between said ring of CRLH material and said MIMO antenna array;

wherein said CRLH-based phase delay line is configured for introducing a first phase delay at a first frequency band, and a second phase delay at a second frequency band; and wherein said CRLH-based phase delay line compensates for phase imbalance and contributes to improved directivity of said MIMO antenna array.

19. A system as recited in embodiment 12:

wherein said first antenna element and said second antenna elements in said MIMO antenna array comprises a composite right-hand left-hand (CRLH) antenna having one or more metamaterial unit cells;

wherein each metamaterial unit cell has an equivalent circuit comprising a right-handed series inductance (LR), a right-handed shunt capacitance (CR), a left-handed series capacitance (CL), and a left-handed shunt inductance (LL); and wherein said CRLH antenna has multiple stable resonances which are substantially independent of physical size.

20. A system, comprising:

(a) a dual-band CRLH hybrid ring coupler of composite right/left-handed (CRLH) transmission line (TL) material having both right handed (RH) and left handed (LH) characteristics;

(b) a plurality of lumped elements comprising inductances and capacitances within said LH portions of said dual-band CRLH hybrid ring coupler;

(c) a plurality of ports on said dual-band CRLH hybrid ring comprising a first input/output port, a second input/output port, a sum port, and a difference port, with said ports separated along said dual-band CRLH hybrid ring by one or more phase $\phi_1$ or phase $\phi_2$;

wherein dual frequency characteristics of each segment of said CRLH TL arise in response to an anti-parallel relationship between phase and group velocities below a transition frequency $\omega_0$, within left handed material (LH) within the CRLH TL, and a parallel relationship between phase and group velocities above transition frequency $\phi_0$ within the right-handed material (RH) within the CRLH TL;

said dual-band CRLH hybrid ring is configured to operate in at least two frequency bands comprising a first frequency band $f_1$ and a second frequency band $f_2$ which has an arbitrary relationship with frequency band $f_1$;

(d) a CRLH-based phase delay line configured for tuning the phase excitation from said dual-band CRLH hybrid ring in response to introducing a first phase delay at a first frequency band, and a second phase delay at a second frequency band; and (e) an antenna array having at least a first antenna element and a second antenna element coupled to said CRLH hybrid ring and said CRLH phase delay line.

21. A system as recited in embodiment 20, wherein said first antenna element and said second antenna element within said antenna array are separated by a predetermined distance; and wherein an endfire radiation pattern is generated from said antenna array in response to the phase delay introduced by said CRLH-based phase delay line and said predetermined distance between antenna elements.

22. A system as recited in embodiment 20, wherein said CRLH-based phase delay line compensates for phase imbalance toward improving directivity.

23. A system as recited in embodiment 20:

wherein each antenna in said antenna array comprises a composite right-hand left-hand (CRLH) antenna having one or more metamaterial unit cells;

wherein each metamaterial unit cell has an equivalent circuit comprising a right-handed series inductance (LR), a right-handed shunt capacitance (CR), a left-handed series capacitance (CL), and a left-handed shunt inductance (LL); and wherein said CRLH antenna has multiple stable resonances which are substantially independent of physical size.

24. A system as recited in embodiment 20, wherein said dual-band CRLH hybrid ring is constrained to phase delay contributions of $|\phi_1|, |\phi_2| \leqq 270°$.

25. A system as recited in embodiment 20, wherein apparatus is configured for operation through a microwave frequency range, with transition frequency $\omega_0$ at or above approximately 100 MHz.

26. A system as recited in embodiment 20, wherein said LH portion of said dual-band CRLH hybrid ring comprises stepped impedance sections in the TL segment corresponding to phase $\phi_2$, said stepped impedance sections tuned toward compensating for self-resonant effects of the lumped elements.

27. A system as recited in embodiment 20, wherein said antenna array comprises a multiple-input multiple-output (MIMO) antenna array.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

| Configuration and Possible TL Phase Responses of Hybrid Ring Coupler | | |
|---|---|---|
| Conventional Hybrid Ring | | |
| $f_1$ | $\phi_1 = -90°$ | $\phi_2 = -270°$ |
| $f_2 = 3f_1$ | $\phi_1 = -270°$ | $\phi_2 = -810°$ |
| CRLH TL Hybrid Ring | | |
| $f_1$ | $\phi_1 = -90°$ | $\phi_2 = -270°$ |
| $f_2$ arbitrary | $\phi_1 = -270°$ | $\phi_2 = -810°$ |
| General CRLH TL Hybrid Ring | | |
| $f_1$ | $\phi_1 = m90°$<br>$m = \ldots -3, -1, 1, 3 \ldots$ | $\phi_2 = m90° \pm 180°$ |
| $f_2$ arbitrary | $\phi_1 = n90°$<br>$n = \ldots -3, -1, 1, 3 \ldots (m > n)$ | $\phi_2 = n90° \pm 180°$ |

TABLE 2

Phase Responses for $\phi_1$ and $\phi_2$ at Dual Frequencies

| Phase Response | $(\phi_1, \phi_2)$ or $(\phi_2, \phi_1)$ |
|---|---|
| Solution #1 | at $f_1$: (90°, 270°), at $f_2$: (−90°, 90°) |
| Solution #2 | at $f_1$: (90°, 270°), at $f_2$: (−90°, −270°) |
| Solution #3 | at $f_1$: (90°, 270°), at $f_2$: (−90°, −270°) |
| Solution #4 | at $f_1$: (−90°, 90°), at $f_2$: (−270°, −90°) |

TABLE 3

Performance of Dual-Band Hybrid Ring Coupler

| Operating Frequency | 2.4 GHz | 5.2 GHz |
|---|---|---|
| Return Loss ($S_{11}$) | −19.62 dB | −23.39 dB |
| $BW_{15dB}$ (below 15 dB) | 26.04% | 28.62% |
| Isolation ($S_{41}$) | −29.97 dB | −22.11 dB |
| $BW_{20dB}$ (below 20 dB) | 154.17% | 71.15% |
| Insertion Loss 1 ($S_{21}$) | −4.04 dB | −4.09 dB |
| Insertion Loss 2 ($S_{31}$) | −3.83 dB | −4.53 dB |
| Magnitude Imbalance | 0.21 dB | 0.44 dB |
| $BW_{15dB}$ | 62.5% | 44.23% |
| Phase Imbalance | 4.3° | 1.9° |
| $BW_{10}$ | 52.08% | 45.44% |

What is claimed is:

1. An apparatus comprising:

a substrate;

a transmission line in the form of a ring, the transmission line comprising right-handed and left-handed characteristics;

a plurality of ports spaced along said transmission line; and a plurality of lumped elements disposed between the plurality of sections of the transmission line between ports.

2. The apparatus recited in claim 1, wherein the transmission line comprises a stepped impedance in a segment of the transmission line between at least two ports.

3. The apparatus recited in claim 2, wherein the stepped impedance is tuned to compensate for self-resonant effects of the lumped elements.

4. The apparatus recited in claim 1, wherein the transmission line is configured to operate in at least two frequency bands.

5. The apparatus recited in claim 1, wherein the plurality of ports comprise a sum port and a difference port.

6. The apparatus recited in claim 1, wherein the plurality of lumped elements comprise at least one cell comprising at least one series capacitor and at least one shunt inductor.

7. The apparatus recited in claim 6, further comprising multiple cells in each segment.

8. The apparatus as recited in claim 7, wherein each of said multiple cells comprises a metamaterial unit cell.

9. The apparatus recited in claim 1, further comprising at least two antenna elements coupled to at least two ports of the plurality of ports.

10. The apparatus recited in claim 9, wherein the at least two antenna elements comprise a multiple-input multiple-output antenna array.

11. The apparatus as recited in claim 1, wherein the right-handed characteristics are provided by a microstrip.

12. A transmitter/receiver coupling apparatus, comprising:

a transmission line arranged in a ring formation and configured to have right-handed and left-handed characteristics, the transmission line configured to operate in at least two frequency bands;

a plurality of lumped elements disposed in segments of the transmission line, the plurality of lumped elements comprising inductances and capacitances configured to form the left-handed portions of the transmission line;

a plurality of ports coupled to said transmission line along a periphery of said ring, said ports including a first input/output port and a second input/output port;

a multiple-input multiple-output antenna array coupled to said transmission line and having a first antenna element coupled to the first input/output port, and a second antenna element coupled to the second input/output port.

13. The apparatus recited in claim 1, wherein the plurality of ports comprise a sum port wherein signal excitation of the sum port generates a sum radiation pattern, on the first antenna element and the second antenna element.

14. The apparatus recited in claim 12, wherein the plurality of ports comprise a difference port wherein signal excitation of the difference port generates a difference radiation pattern, on said first antenna element and said second antenna element.

15. The apparatus recited in claim 12, further comprising a phase delay line coupled between the transmission line and the multiple-input multiple-output antenna array, the phase delay line configured to introduce a first phase delay at a first frequency band, and a second phase delay at a second frequency band.

16. The apparatus recited in claim 12, wherein the multiple-input multiple-output antenna array comprises one or more metamaterial unit cells.

17. The apparatus recited in claim 12, further comprising a stepped impedance section in at least one segment of the transmission line, the at least one segment of the transmission line having a phase advance, wherein the stepped impedance section is tuned to compensate for self-resonant effects of the lumped elements.

18. The apparatus recited in claim 12, wherein the transmission line is configured for operation in a microwave frequency range.

19. The apparatus recited in claim 12, wherein at least two frequency bands are selected at arbitrary frequencies.

20. The apparatus recited in claim 12, wherein each port in the plurality of ports is configured with the same port impedance.

* * * * *

UNITED STATES PATENT AND TRADEMARK OFFICE

CERTIFICATE OF CORRECTION

PATENT NO. : 8,416,033 B2
APPLICATION NO. : 13/311456
DATED : April 9, 2013
INVENTOR(S) : Itoh et al.

It is certified that error appears in the above-identified patent and that said Letters Patent is hereby corrected as shown below:

On the Title Page, in Item [56], under "OTHER PUBLICATIONS", in Column 2, Lines 5-8, delete "Okabe et al., A Compact Enhanced-Bandwidth Hybrid Ring Using an Artificial Lumped-Element Left-Handed Transmission-Line Section, Mar. 2004, IEEE Transactions on Microwave Theory, vol. 52, No. 3, pp. 798-804.".

In the Specification

Column 8, Line 10, delete "($\omega_0$," and insert -- $\omega_0$, --, therefor.

Column 10, Lines 21-22, delete "$f_1$:(-90°,90° and $f_2$:(-270°, -90°." and insert -- $f_1$:(-90°,90°) and $f_2$:(-270°, -90°). --, therefor.

Column 12, Line 9, delete "dBi" and insert -- dB --, therefor.

Column 13, Line 50, delete "(0°, -90°" and insert -- (0°, -90°) --, therefor.

Column 15, Line 65, delete "(0°, -90°" and insert -- (0°, -90°) --, therefor.

Column 18, Line 58, delete "$\varphi_1$, $\varphi_2$, or $\varphi_2$, $\varphi_1$)" and insert -- ($\varphi_1$, $\varphi_2$, or $\varphi_2$, $\varphi_1$) --, therefor.

Column 18, Line 59, delete "(-90°,90° in frequency band $f_1$ and (-270°, -90°" and insert -- (-90°,90°) in frequency band $f_1$ and (-270°, -90°) --, therefor.

Column 19, Line 63, delete "(-90°,90° in frequency band $f_1$ and (-270°, -90°" and insert -- (-90°,90°) in frequency band $f_1$ and (-270°, -90°) --, therefor.

Column 20, Line 64, delete "$\varphi_0$" and insert -- $\omega_0$ --, therefor.

Signed and Sealed this
Twenty-fifth Day of March, 2014

Michelle K. Lee

Michelle K. Lee
*Deputy Director of the United States Patent and Trademark Office*

In the Claims

Column 24, Line 1, in Claim 13, delete “claim 1,” and insert -- claim 12; --, therefor.